(12) United States Patent
Au et al.

(10) Patent No.: US 7,099,231 B2
(45) Date of Patent: Aug. 29, 2006

(54) INTERLEAVING MEMORY BLOCKS TO RELIEVE TIMING BOTTLENECK IN A MULTI-QUEUE FIRST-IN FIRST-OUT MEMORY SYSTEM

(75) Inventors: Mario Au, Fremont, CA (US); Jason Z. Mo, Fremont, CA (US); Ta-Chung Ma, San Jose, CA (US); Lan Lin, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/040,895

(22) Filed: Jan. 21, 2005

(65) Prior Publication Data

US 2006/0018170 A1 Jan. 26, 2006

Related U.S. Application Data

(60) Provisional application No. 60/600,347, filed on Aug. 9, 2004, provisional application No. 60/591,499, filed on Jul. 26, 2004.

(51) Int. Cl.
*G11C 8/16* (2006.01)
*G11C 7/08* (2006.01)

(52) U.S. Cl. ............ 365/230.04; 365/230.03; 365/189.02; 365/236; 711/149; 711/157

(58) Field of Classification Search ............ 365/230.03, 365/230.04, 230.05, 189.02, 236, 221; 711/149, 711/157

See application file for complete search history.

(56) References Cited

U.S. PATENT DOCUMENTS

| | | | |
|---|---|---|---|
| 5,084,891 A | 1/1992 | Ariyavisitakul et al. | 714/775 |
| 5,506,809 A | 4/1996 | Csoppenszky et al. | 365/221 |
| 5,508,679 A | 4/1996 | McClure | 340/146.2 |
| 6,678,759 B1 | 1/2004 | Stockton et al. | 710/52 |
| 2006/0017497 A1* | 1/2006 | Mo et al. | 327/551 |
| 2006/0020743 A1* | 1/2006 | Au et al. | 711/101 |

\* cited by examiner

*Primary Examiner*—Andrew Q. Tran
(74) *Attorney, Agent, or Firm*—Bever, Hoffman, & Harms, LLP

(57) ABSTRACT

A multi-queue memory system includes first and second memory blocks. The first memory block includes a first array of memory cells, a first sense amplifier circuit and a second sense amplifier circuit. The second memory block includes a second array of memory cells, a third sense amplifier circuit and a fourth sense amplifier circuit. Each of the sense amplifier circuits is independently controlled. Each queue of the multi-queue system has entries in both the first and second memory blocks. A first queue is accessed by alternately accessing the first and second arrays via the first and third sense amplifier circuits. A second queue is subsequently accessed by alternately accessing the first and second arrays via the second and fourth sense amplifier circuits.

11 Claims, 17 Drawing Sheets

US 7,099,231 B2

INTERLEAVING MEMORY BLOCKS TO RELIEVE TIMING BOTTLENECK IN A MULTI-QUEUE FIRST-IN FIRST-OUT MEMORY SYSTEM

RELATED APPLICATIONS

The present application is related to, and incorporates by reference, U.S. Provisional Patent Application Ser. No. 60/591,499 filed by Mario Au, Jason Z. Mo, Xiaoping Fang, Hui Su, Cheng-Han Wu, Ta-Chung Ma and Lan Lin on Jul. 26, 2004. The present application is also related to, and incorporates by reference, U.S. Provisional Patent Application Ser. No. 60/600,347 filed by Mario Au, Jason Z. Mo, Xiaoping Fang, Hui Su, Cheng-Han Wu, Ta-Chung Ma and Lan Lin on Aug. 9, 2004.

The present application is also related to, and incorporates by reference, the following commonly owned, co-filed U.S. patent applications.

U.S. patent application Ser. No. 11/040,892 "Multiple Counters to Relieve Flag Restriction in a Multi-Queue First-In First-Out Memory System" by Mario Au and Jason Z. Mo.

U.S. patent application Ser. No. 11/040,637 "Mark/Re-Read and Mark/Re-Write Operations in a Multi-Queue First-In First-Out Memory System" by Mario Au and Jason Z. Mo.

U.S. patent application Ser. No. 11/040,896 "Partial Packet Read/Write and Data Filtering in a Multi-Queue First-In First-Out Memory System" by Mario Au, Jason Z. Mo and Hui Su.

U.S. patent application Ser. No. 11/040,804 "Synchronization of Active Flag and Status Bus Flags in a Multi-Queue First-In First-Out Memory System" by Mario Au, Jason Z. Mo and Cheng-Han Wu.

U.S. patent application Ser. No. 11/040,893 "Status Bus Accessing Only Available Quadrants During Loop Mode Operation in a Multi-Queue First-In First-Out Memory System" by Mario Au, Jason Z. Mo and Cheng-Han Wu.

U.S. patent application Ser. No. 11/040,926 "Multi-Queue Address Generator for Start and End Addresses in a Multi-Queue First-In First-Out Memory System" by Mario Au, Jason Z. Mo and Xiaoping Fang.

U.S. patent application Ser. No. 11/040,927 "Self-Timed Multiple Blanking For Noise Suppressiong During Flag Generation in a Multi-Queue First-In First-Out Memory System" by Mario Au and Jason Z. Mo.

FIELD OF THE INVENTION

The present invention relates to a multi-queue first in, first out (FIFO) memory.

PRIOR ART

In a conventional multi-queue FIFO memory, a queue switch may be performed, wherein during a read (or write) operation, processing switches from one queue (a present queue) to another queue (a new queue).

FIG. 1 is a waveform diagram illustrating a typical queue switch performed during a read operation. Read operations in the conventional multi-queue FIFO memory are performed to provide output data (DOUT) in response to a read clock signal (RCLK), a read enable signal (REN#), a read address enable signal (RADEN), a read counter value (RCNT), a write counter value (WCNT), a programmable almost empty flag (PAE#) and an empty flag (EF).

In FIG. 1, the read enable signal REN# is activated low, thereby indicating that read operations should be performed. The read clock signal RCLK exhibits queue switch cycles QS-1, QS0, QS1, QS2 and QS3, which are labeled with respect to the time that the read address enable signal RADEN is activated. The read address enable signal RADEN is activated prior to the beginning of cycle QS-1, thereby indicating that a queue switch should be performed. That is, data should no longer be read from a present queue (PQ), but rather from a new queue (NQ) identified by a new read address (not shown). In the described example, there is a four-cycle latency during a queue switch, such that data (NQ1, NQ2) is not read from the new queue until cycle QS3.

After the read address enable signal RADEN is activated, data values PQ1, PQ2, PQ3 and PQ4 are read from the present queue during the next four cycles QS-1, QS0, QS1, and QS2, respectively. During the cycles QS-1, QS0 and QS1, the read counter value ($RCNT_p$) and write counter value ($WCNT_p$) associated with the present queue are compared to generate the present programmable almost empty flag ($PAE\#_p$) and the present empty flag ($EF_p$).

Also during cycles QS-1, QS0 and QS1, the read counter value ($RCNT_N$) and the write counter value ($WCNT_N$) associated with the new queue are retrieved from memory. The new read counter value $RCNT_N$ and the new write counter value $WCNT_N$ become active during cycle QS2. The new read counter value $RCNT_N$ and the new write counter value $WCNT_N$ are compared to generate a new programmable almost empty flag value ($PAE\#_N$) and a new empty flag value ($EF_N$), which also become active during cycle QS2. Thus, during cycle QS2, the programmable almost empty flag PAE# and the empty flag EF represent the status of the new queue, even though the data value PQ4 is read from the present queue during cycle QS2.

A problem will exist if the present queue is not empty during cycle QS2, and the data value PQ4 is provided as an output value. An internal counter needs to keep track of this read operation for the present queue, and at the same time provide count values for new queue flag calculation. This problem has been solved by using a pipeline scheme at the output terminals of the write counter and the read counter, and by specifying a forced-word-fall-through (FWFT) restriction on the data output during a queue switch. Thus, if the present queue is not empty, the last data before queue switch will be output in cycle QS2 even though there is no active external read signal. This enables the read counter to predict what happens during cycle QS2, instead of relying on what actually occurs during cycle QS2. However, this scheme undesirably requires the user to process data during cycle QS2.

It would therefore be desirable to have a multi-queue FIFO memory system that is capable of determining exactly how many read operations have been performed on the present queue, without any prediction or forced data out.

Data is read out of the multi-queue FIFO memory when the FIFO is not empty and an external read access is enabled. A read access is typically enabled with a one-cycle pre-fetch of data. Thus, the empty flag status of the FIFO is initially examined to determine if at least one read data value is available. If a read data value is available, this data value is read out from the internal memory of the FIFO, and is ready to be output whenever an external read access is enabled. If consecutive read accesses are enabled, the internal memory of the FIFO has to be read at the same speed as the external read bus (e.g., 200 MHz). This becomes a significant challenge in timing design as memory becomes larger and logic on the data-path becomes more complicated.

It would therefore be desirable to have a method and structure to alleviate the timing bottlenecks associated with reading a multi-queue FIFO memory.

SUMMARY

Accordingly, the present invention includes a multi-queue memory system that includes a first memory block and a second memory block. The first memory block includes a first array of memory cells, a first sense amplifier circuit and a second sense amplifier circuit. The first and second sense amplifier circuits are both coupled to the first array of memory cells, and are independently controlled. The second memory block includes a second array of memory cells, a third sense amplifier circuit and a fourth sense amplifier circuit. The third and fourth sense amplifier circuits are both coupled to the first array of memory cells, and are independently controlled. Each queue of the multi-queue system has entries in both the first and second memory blocks. For example, a first queue of the multi-queue memory device is accessed by alternately accessing the first and second arrays via the first and third sense amplifier circuits. A second queue is subsequently accessed by alternately accessing the first and second arrays via the second and fourth sense amplifier circuits. This configuration allows accesses to the first and second memory blocks to be performed at half-speed with respect to a conventional multi-queue memory system, thereby alleviating the timing bottlenecks associated with accessing a multi-queue memory system.

In one variation, the first array and second array are each logically divided into two memory planes, each having a dedicated word line decoder circuit.

In accordance with another embodiment, the multi-queue memory system includes a read memory address register system that includes three read counters. A first read counter is configured to store a first read address, which is used to pre-fetch read data from a queue of the multi-queue memory system. A second read counter is configured to store a second read address, which is associated with data actually read from a first queue of the multi-queue memory system. A third read counter is configured to store a third read address, which is associated with data actually read from a second queue of the multi-queue memory system. This read address register system advantageously allows read data to be pre-fetched, while accurately maintaining read addresses for each of the queues.

The present invention will be more fully understood in view of the following description and drawings.

DETAILED DESCRIPTION

The present invention includes a multi-queue flow-control device, which is implemented on a single chip. The multi-queue device can be configured to implement between 1 and 128 discrete FIFO queues. The user has full flexibility configuring queues within the device, being able to program the total number of queues between 1 and 128. The user can also independently select the individual queue depths.

All queues within the device have a common data input bus (write port), and a common data output bus (read port). Data written to the write port is directed to a respective queue via an internal de-multiplexer, which is addressed by a user. Data read from the read port is accessed from a respective queue via an internal multiplexer, addressed by the user. Data writes and reads can be performed at high speeds (up to 200 MHz, with access times of 3.6 ns in accordance with one embodiment of the present invention). Data write and read operations are totally independent of each other. Thus, a queue may be selected on the write port, and a different queue may be selected on the read port. Alternately, read and write operations may be selected on the same queue simultaneously.

The device provides a Full Flag (FF#) and an Empty Flag (EF#) that identify the status of the queues selected for write and read operations, respectively. The device also provides a Programmable Almost Full Flag (PAF#) and a Programmable Almost Empty Flag (PAE#) that identify the status of the queues selected for write and read operations, respectively. The positions of the PAF# and PAE# flags are programmable by the user. The flags for queue N are specified by the flag name, followed by N (e.g., PAF#_N).

Figure 1:
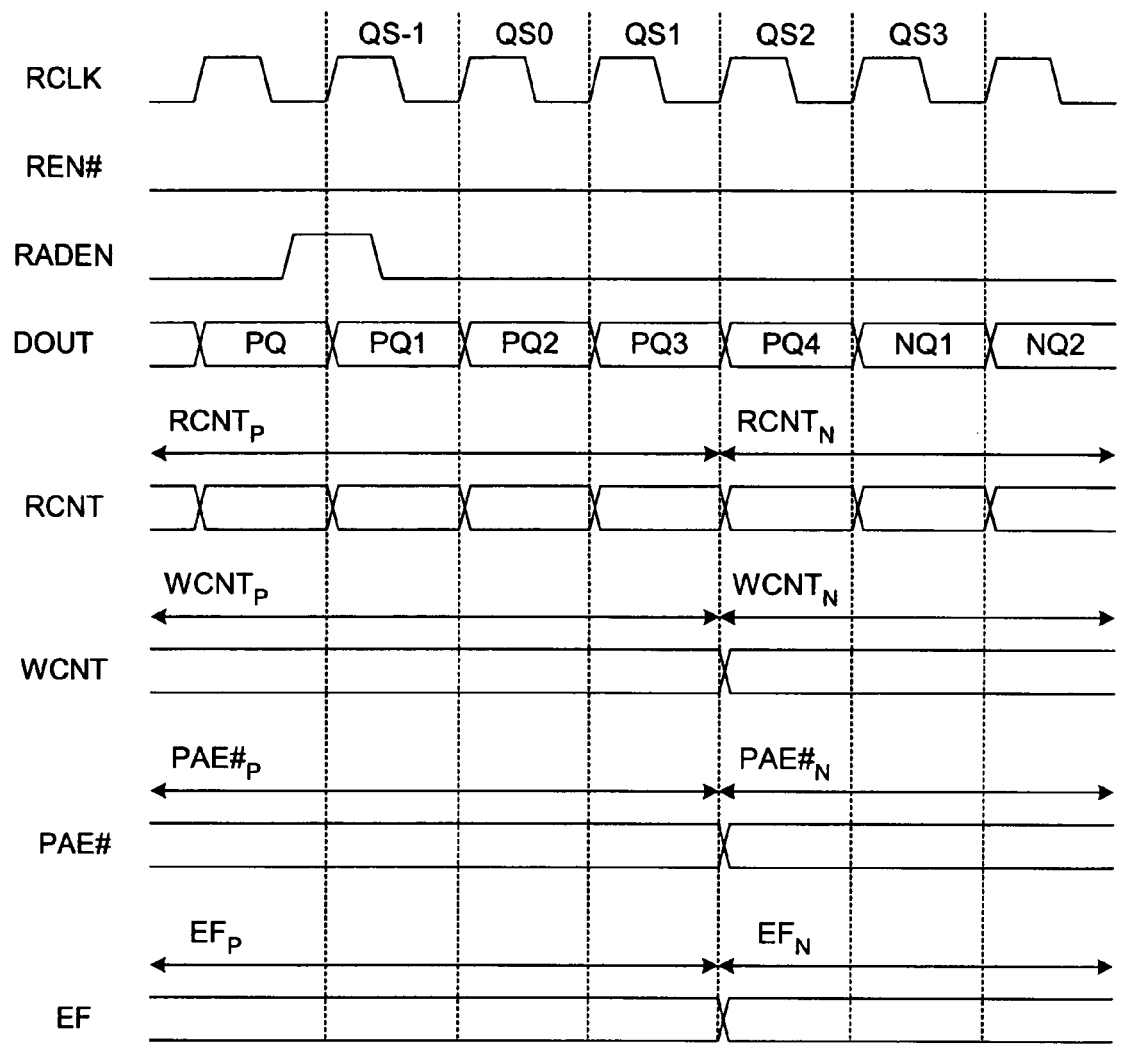
FIG. 1 is a waveform diagram illustrating a typical queue switch performed during a read operation.
Figure 2:
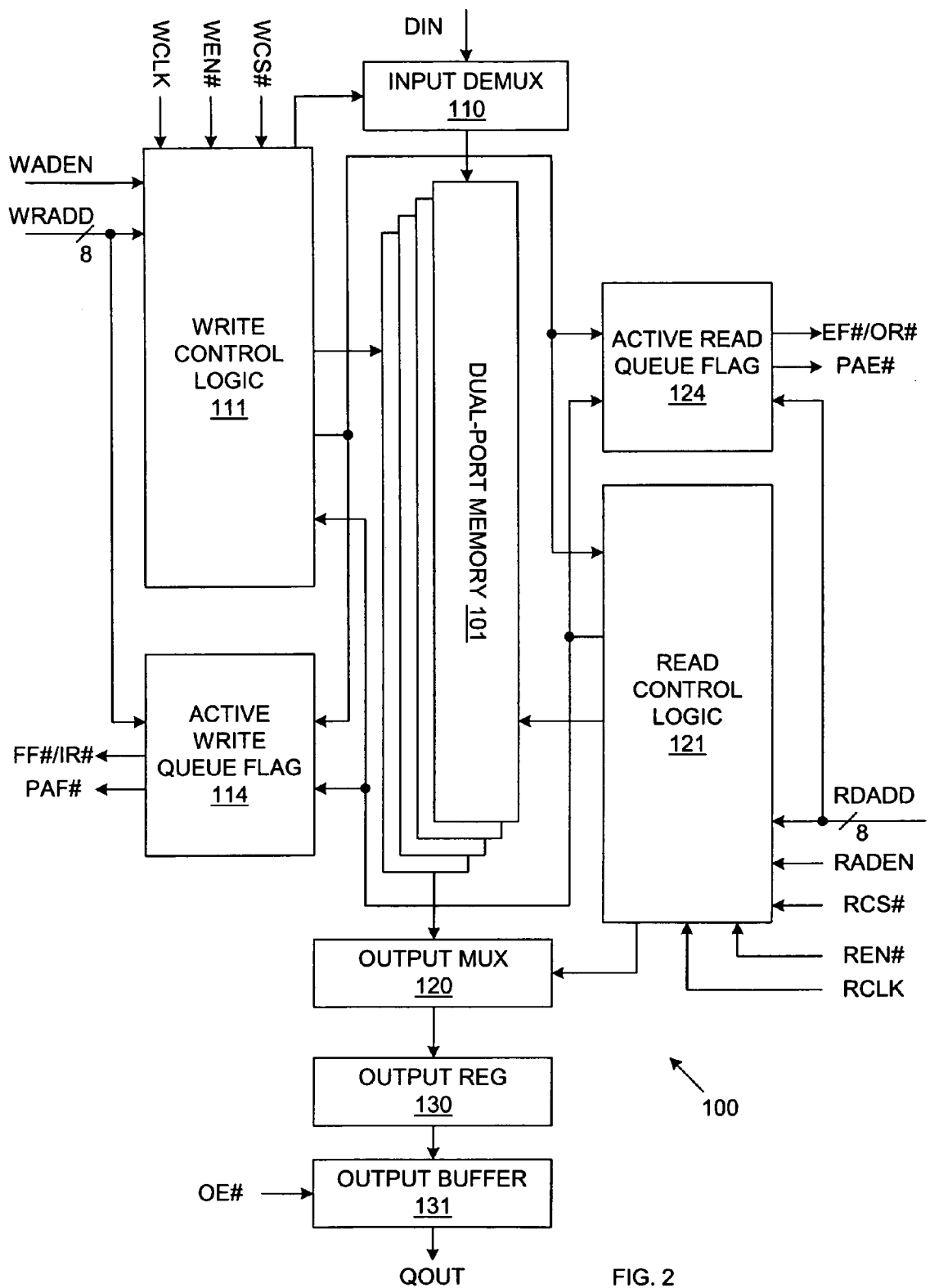
FIG. 2 is a block diagram of a multi-queue flow-control device in accordance with one embodiment of the present invention.

FIG. 2 is a block diagram of a multi-queue flow-control device 100 in accordance with one embodiment of the present invention. Device 100 includes dual-port memory 101, write port (de-multiplexer) 110, write control logic 111, active write queue flag circuit 114, output multiplexer 120, read control logic 121, active read queue flag circuit 124, output register 130 and output buffer 131. In the described embodiment, dual-port memory is a 4.7 Mbit memory, which can be logically divided into up to 128 FIFO queues, each having a minimum capacity of 9 k bits.

In general, write control logic 111 controls write accesses to the various queues in dual-port memory 101. More specifically, write control logic 111 provides the required control/address signals to input de-multiplexer 110 and dual-port memory 101 in response to a write chip select signal WCS#, a write enable signal WEN#, a write clock signal WCLK, a write address signal WRADD[7:0] and a write address enable signal WADEN. As described in more detail below, write control logic 111 also provides control signals to active write queue flag circuit 114, active read queue flag circuit 124 and read control logic 121.

Similarly, read control logic 121 controls read accesses from the various queues in dual-port memory 101. More specifically, read control logic 121 provides the required control/address signals to output multiplexer 120 and dual-port memory 101 in response to a read chip select signal RCS#, a read enable signal REN#, a read clock signal RCLK, a read address signal RDADD[7:0] and a read address enable signal RADEN. As described in more detail below, read control logic 121 also provides control signals to active write queue flag circuit 114, active read queue flag circuit 124 and write control logic 111.

As described in more detail below, active write queue flag circuit 114 generates a full flag FF# (input ready flag IR#) and programmable almost full flag PAF# in response to the write address WRADD[7:0] and the control signals received by write control logic 111 and read control logic 121. Also, as described in more detail below, active read queue flag circuit 124 generates an empty flag EF# (output ready flag OR#) and programmable almost empty flag PAE# in response to the read address RDADD[7:0] and the control signals received by write control logic 111 and read control logic 121.

Read operations to multi-queue device 100 will now be described. In general, when a queue within dual-port memory 101 is selected for a read operation, the next word in the selected queue automatically falls through output multiplexer 120 to the output register 130. All subsequent words from the selected queue require an enabled read cycle in order to be routed to the output register 130. Data cannot be read from the selected queue if the queue is empty. The active read queue flag circuit 124 provides an active-low empty flag/output ready signal (EF#/OR#) indicating when the data read from the selected queue is valid. If the user switches to a queue that is empty, the last word read from the previous queue will remain in the output register 130. As described in more detail below, dual-port memory 101 exhibits a four-cycle latency when switching from one queue to another queue (i.e., during a queue switch).

Figure 3:
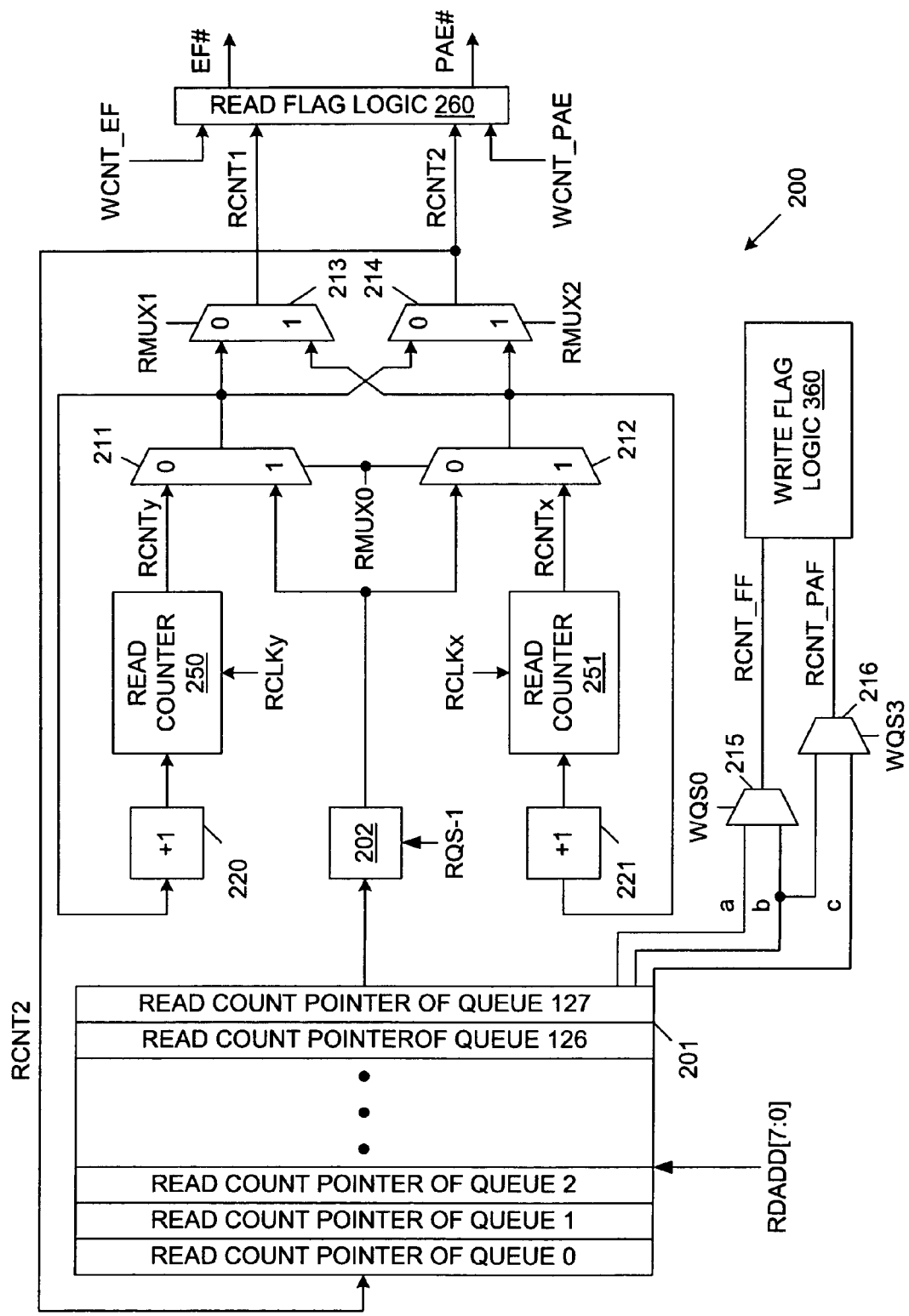
FIG. 3 is a block diagram of a read flag counter register (FCR) file having multiple read counters in accordance with one embodiment of the present invention.

FIG. 3 is a block diagram of a read flag counter register (FCR) system 200, which is located in read control logic block 121 and active read queue flag circuit 124, in accordance with one embodiment of the present invention. Read FCR system 200 includes read FCR file 201, register 202, multiplexers 211–214, adder circuits 220–221, read counters 250–251 and read flag logic 260.

Read FCR file 201 includes 128 entries, one for each possible queue in multi-queue device 100. Each entry stores a read count pointer for a corresponding queue. Each entry of read FCR file 201 is coupled to register 202 via a selection circuit (not shown). As described in more detail below, register 202 latches a read count pointer retrieved from read FCR file 201 at the start of a queue switch (during cycle QS-1). The read count pointer stored in register 202 is applied to the "1" input terminal of multiplexer 211 and the "0" input terminal of multiplexer 212.

The output terminal of multiplexer 211 is coupled to the "0" input terminals of multiplexers 213 and 214 and to adder 220. Similarly, the output terminal of multiplexer 212 is coupled to the "1" input terminals of multiplexers 213 and 214 and to adder 221. Adders 220 and 221 each add one to the read count values provided by multiplexers 211 and 212, respectively. Adders 220 and 221 apply the incremented read count values to read counters 250 and 251, respectively. Read counters 250 and 251 latch the incremented read count values on rising edges of the RCLKy and RCLKx read clock signals, respectively. Read counters 250 and 251 apply output read count values RCNTy and RCNTx, respectively, to the "0" and "1" input terminals of multiplexers 211 and 212, respectively. In the described embodiment, multiplexers 211 and 212 are controlled by the same control signal RMUX0, although this is not necessary. Multiplexers 213 and 214 are controlled by RMUX1 and RMUX2 signals, respectively. Multiplexer 213 provides an output signal RCNT1, and multiplexer 214 provides an output signal RCNT2, which are used to derive the empty flag, EF# and the programmable almost empty flag, PAE#, respectively. The RCNT2 signal is also routed back to read FCR file 201, such that the read FCR file is updated to store changes in the RCNT2 signal during each read cycle.

Figure 4:
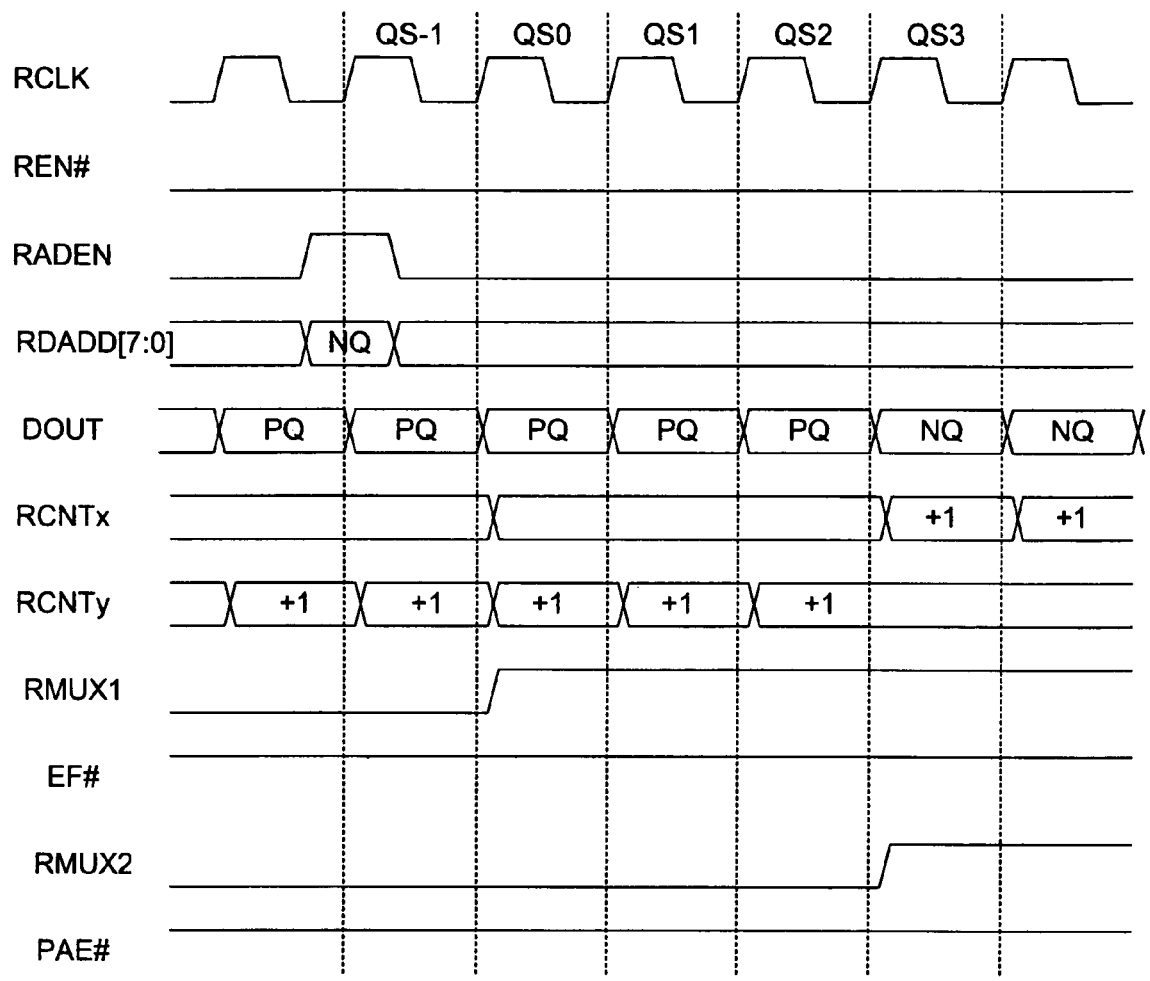
FIGS. 4, 5, 6, 7 are waveform diagrams illustrating the operation of the read FCR file of FIG. 3 in accordance with various embodiments of the present invention.

FIG. 4 is a waveform diagram illustrating the operation of read FCR system 200 in accordance with one embodiment of the present invention.

Figure 8:
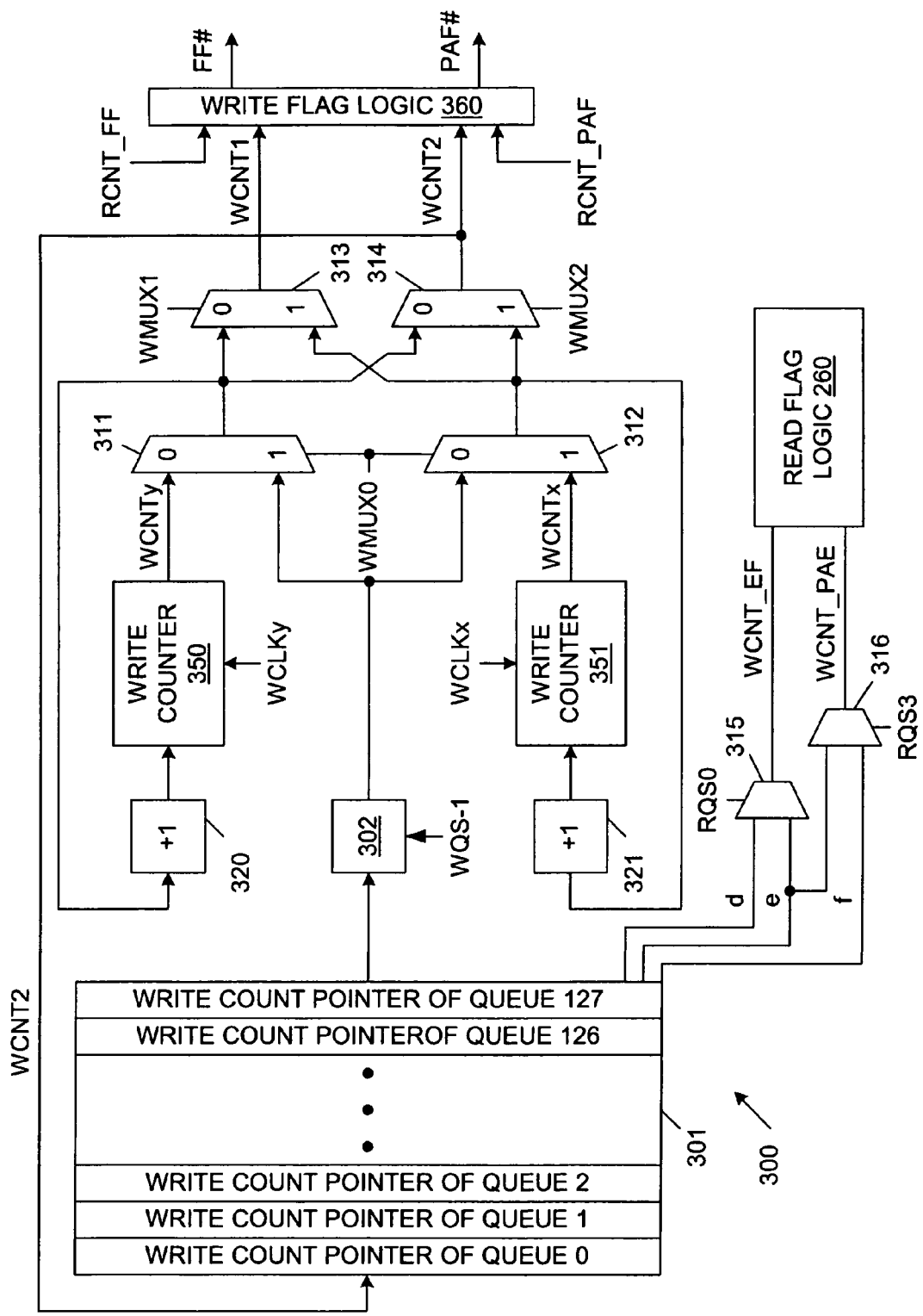
FIG. 8 is a block diagram of a write flag counter register (FCR) file in accordance with one embodiment of the present invention.

The read clock signal RCLK, read enable signal REN#, read address enable signal RADEN and read address signal RDADD[7:0] are applied to read control logic 121 (FIG. 2). Relevant cycles of the RCLK signal are labeled QS-1, QS0, QS1, QS2 and QS3. Prior to read cycle QS-1, data is being read from a first queue, which is hereinafter referred to as the present queue (PQ). At this time, read FCR system 200 is configured as follows. The read clock signal RCLK is routed as the read clock signal RCLKy to read counter 250. Read counter 250 maintains a read count value (RCNTy) associated with the present queue PQ. The RMUX0 signal has a logic "0" value, such that multiplexer 211 routes the RCNTy value provided by read counter 250 to multiplexers 213 and 214. The RMUX1 and RMUX2 signals both have a logic "0" value, such that multiplexers 213 and 214 route the RCNTy value as the RCNT1 and RCNT2 signals, respectively, to read flag logic 260. At this time, read flag logic 260 generates the empty flag EF# and programmable almost empty flag PAE# in response to the read count value RCNTy associated with the present queue PQ. More specifically, read flag logic 260 generates the empty flag EF# in response to the RCNT1 signal and a write pointer value WCNT_EF provided by a write FCR system 300 (FIG. 8). Similarly, read flag logic 260 generates the programmable almost empty flag PAE# in response to the RCNT2 signal and another write pointer value WCNT_PAE provided by the write FCR file. In general, WCNT_EF is the write count pointer of the same queue represented by the RCNT1 read count pointer, and WCNT_PAE is the write count pointer of the same queue represented by the RCNT2 read count pointer. The operation of multiplexers 315 and 316 is described in more detail in "Method to Optimize Interfaces Between Driver and Receiver Circuits in Datapaths" by Prashant Shamarao, Jason Z. Mo and Jianghui Su, U.S. Provisional Patent Application Ser. No. 60/555716, filed Mar. 23, 2004, which is hereby incorporated by reference.

Each time that a read operation is performed from the present queue PQ, the read clock signal RCLKy is asserted, thereby causing read counter 250 to latch the incremented read count value (i.e., RCNTy plus 1) provided by adder circuit 220. Read flag logic 260 then uses the incremented RCNTy signal to generate the EF# and PAE# flags associated with the present queue PQ. In the present example, the EF# and PAE# flags associated with the present queue PQ remain de-activated high, thereby indicating that the present queue is neither empty nor almost empty.

Prior to the start of read cycle QS-1, the read address enable signal RADEN transitions to a logic "1" state, thereby indicating that a queue switch (QS) will be performed. That is, the read operations from the present queue PQ will be stopped, and read operations will be performed from a new queue (NQ) in dual port memory 101. The address of the new queue NQ is identified by the read address signal RDADD[7:0]. The RADEN and RDADD[7:0] signals are detected at the beginning of read cycle QS-1 (at the rising edge of the RCLK signal).

In response to the detected RADEN signal, read FCR file 201 retrieves the read count pointer from the register corresponding to the queue identified by the RDADD[7:0] signal. For example, if the read address signal RDADD[7:0] identifies queue 2, then read FCR file 201 provides the read count pointer of queue 2 to register 202. The write FCR system 300 (FIG. 8) also retrieves the write count pointer associated with the addressed queue (e.g., queue 2) on port "d" at this time. Data is read from the present queue and the read count value RCNTy is incremented during read cycle QS-1.

By the start of the next read cycle QS0, the read count pointer retrieved from read FCR file 201 has been loaded into register 202. At this time, multiplexer 212 routes the read count pointer stored in register 202 to the logic "1" input terminals of multiplexers 213 and 214, and to the input terminal of adder circuit 221. Also at the start of read cycle QS0, the RMUX1 signal transitions to a logic "1" value, thereby causing multiplexer 213 to route the newly retrieved read point counter associated with the new queue NQ as the RCNT1 signal. Also, at the start of read cycle QS0, the write FCR system 300 provides the newly retrieved write point counter associated with the new queue NQ as the WCNT_EF signal. In response, read flag logic 260 starts to generate a new empty flag EF# in response to the retrieved read and write count pointers associated with the new queue NQ. Data (DOUT) is still read from the present queue (and the read count value RCNTy is incremented) during read cycle QS0. Note that the RCNTy value associated with the present queue PQ signal (and provided as the RCNT2 signal) and a write count pointer associated with the present queue (WCNT_PAE) are still used to generate the programmable almost empty PAE# flag during the read cycle QS0.

During cycles QS1 and QS2, the read enable signal REN# remains activated low, thereby enabling data values to be read from the present queue PQ during cycles QS1 and QS2, and enabling read clock counter 250 to increment the RCNTy value at the rising edges of read cycles QS1 and QS2. As described in more detail below, the read enable signal REN# can be de-activated high prior to the beginning of a read cycle, thereby preventing data values from being read from the queue during the read cycle. In this case, the high REN# signal prevents the read clock signal RCLKy from clocking read counter 250, such that the read count value RCNTy is not incremented during the read cycle.

The last data value to be read from the present queue PQ is provided during read cycle QS2. The read count value RCNTy is routed through multiplexers 211 and 214 to read FCR file 201 as the RCNT2 signal. During read cycle QS2, the read count value RCNTy is stored as the read count pointer associated with the present queue PQ in read FCR file 201.

At the end of read cycle QS2, the read count value RCNTy provided by read counter 250 is representative of the exact number of read operations that have been performed to the present queue PQ, without any prediction, pipelining or forced data out. Consequently, the next time the present queue is accessed, the read count pointer retrieved from read FCR file 201 accurately represents the read address of this queue.

At the start of read cycle QS2, read flag logic 260 provides an empty flag EF# representative of the status of the new queue NQ. As described above, this empty flag EF# is provided in response to the read count pointer previously stored in register 202 during read cycle QS0 and provided as the RCNT1 signal.

Note that during cycle QS1, read flag logic 260 decodes the address of the new queue NQ, and retrieves a previously stored programmable almost empty flag PAE#, which identifies the almost empty status of the new queue NQ. During cycle QS2, read flag logic 260 provides the PAE# flag associated with the new queue as the active PAE# flag. The active PAE# flag associated with the new queue is then updated during cycle QS3 (and during subsequent cycles). This process provides an accurate result, because the earliest that a read operation can be performed to the new queue is during cycle QS3. The logic used to generate the programmable almost empty flag is described in more detail in U.S. patent application Ser. No. 11/040,804, "Synchronization of Active Flag and Status Bus Flags in a Multi-Queue First-In First-Out Memory System", by Mario Au, Jason Z. Mo and Cheng-Han Wu, which is hereby incorporated by reference.

Also during read cycle QS2, a write count pointer associated with the new queue is retrieved on port "f" of the write FCR system 300.

During read cycle QS3, data is read from the new queue NQ. More specifically, data is read from the address of the new queue NQ identified by the read count pointer stored in register 202. At the start of read cycle QS3, the read clock signal RCLK is routed to read counter 251 as the read clock signal RCLKx. At the rising edge of read cycle QS3, read counter 251 latches an incremented read count value (RCNTx plus 1) provided by adder circuit 221. During read cycle QS3, the RMUX0 signal is controlled to have a logic "1" state, thereby causing multiplexer 212 to route the incremented read count value RCNTx from read counter 251 to multiplexers 213 and 214. The multiplexer control signal RMUX2 is also controlled to have a logic "1" value, thereby causing multiplexer 214 to route the incremented read count value RCNTx associated with the new queue to read flag logic 260. The write count pointer associated with the new queue is retrieved on port "f" of the write FCR system 300 and provided to read flag logic 260 as the write count pointer WCNT_PAE during cycle QS3. Read flag logic 260 then begins to generate the programmable almost empty flag PAE# in response to the new read count pointer RCNT2 and the new write count pointer WCNT_PAE.

Figure 5:
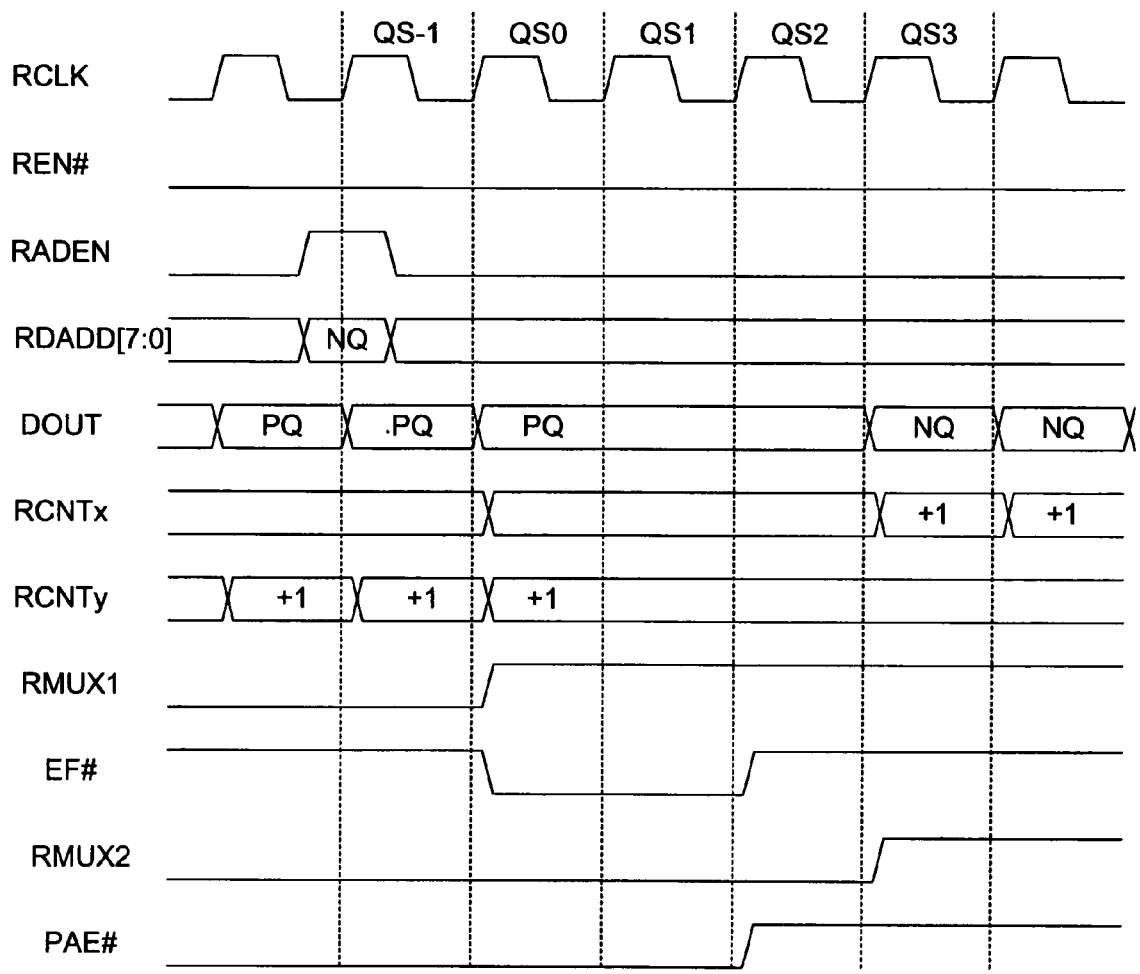

FIG. 5 is a waveform diagram illustrating the operation of read FCR system 200 in accordance with another embodiment of the present invention. The embodiment of FIG. 5 is similar to the embodiment of FIG. 4, with differences noted below. In the embodiment of FIG. 5, the last data value in the present queue PQ is read during read cycle QS0. Because the present queue becomes empty during read cycle QS0, the empty flag EF# is activated low during this read cycle. Note that the programmable almost empty flag PAE# was activated low in previous read cycles. The logic low empty flag EF# prevents additional data values from being read from the present queue, and prevents the read count value RCNTy from being incremented. This is accomplished by basic FIFO read logic, which feeds back the status of the empty flag EF# to prevent read operations from occurring (i.e., an internal read is only activated if the empty flag EF# is high and the read enable signal REN# is low).

The new queue NQ is neither empty nor almost empty in the example of FIG. 5. Consequently, the empty flag EF# and programmable almost empty flag PAE# are activated high during read cycle QS2, thereby indicating the non-empty status of the new queue NQ. A data value is read from the new queue NQ during read cycle QS3 in the manner described above in connection with FIG. 4.

Figure 6:
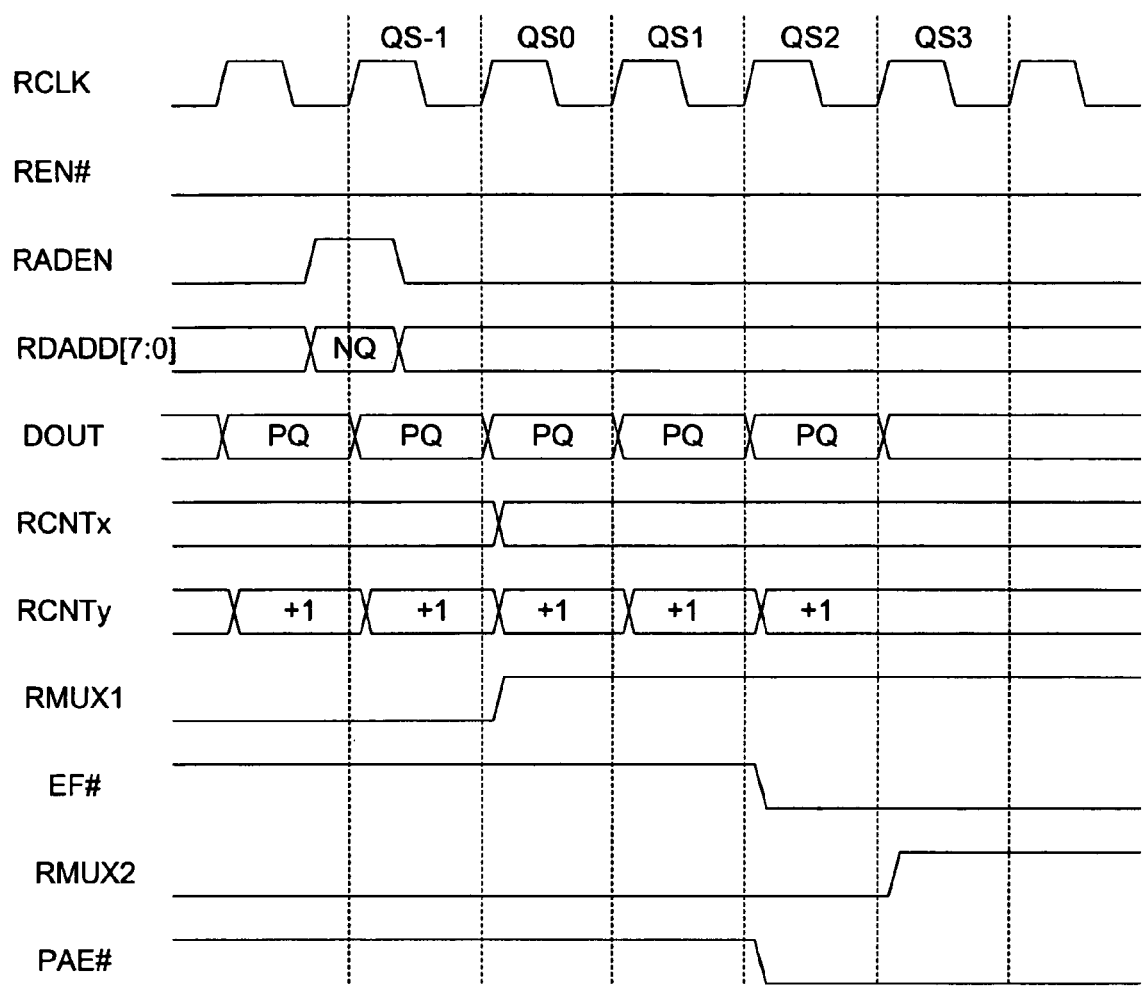

FIG. 6 is a waveform diagram illustrating the operation of read FCR system 200 in accordance with another embodiment of the present invention. The embodiment of FIG. 6 is similar to the embodiment of FIG. 4, with differences noted below. In the embodiment of FIG. 6, data values are read from the present queue PQ through read cycle QS2 in the manner described above in connection with FIG. 4. However, in the example of FIG. 6, the new queue is empty during cycle QS3. Because the new queue is empty, the empty flag EF# and the programmable almost empty flag PAE# are activated low during read cycle QS2. The logic low empty flag EF# prevents data values from being read from the new queue, and prevents the read count value RCNTx from being incremented.

Figure 7:
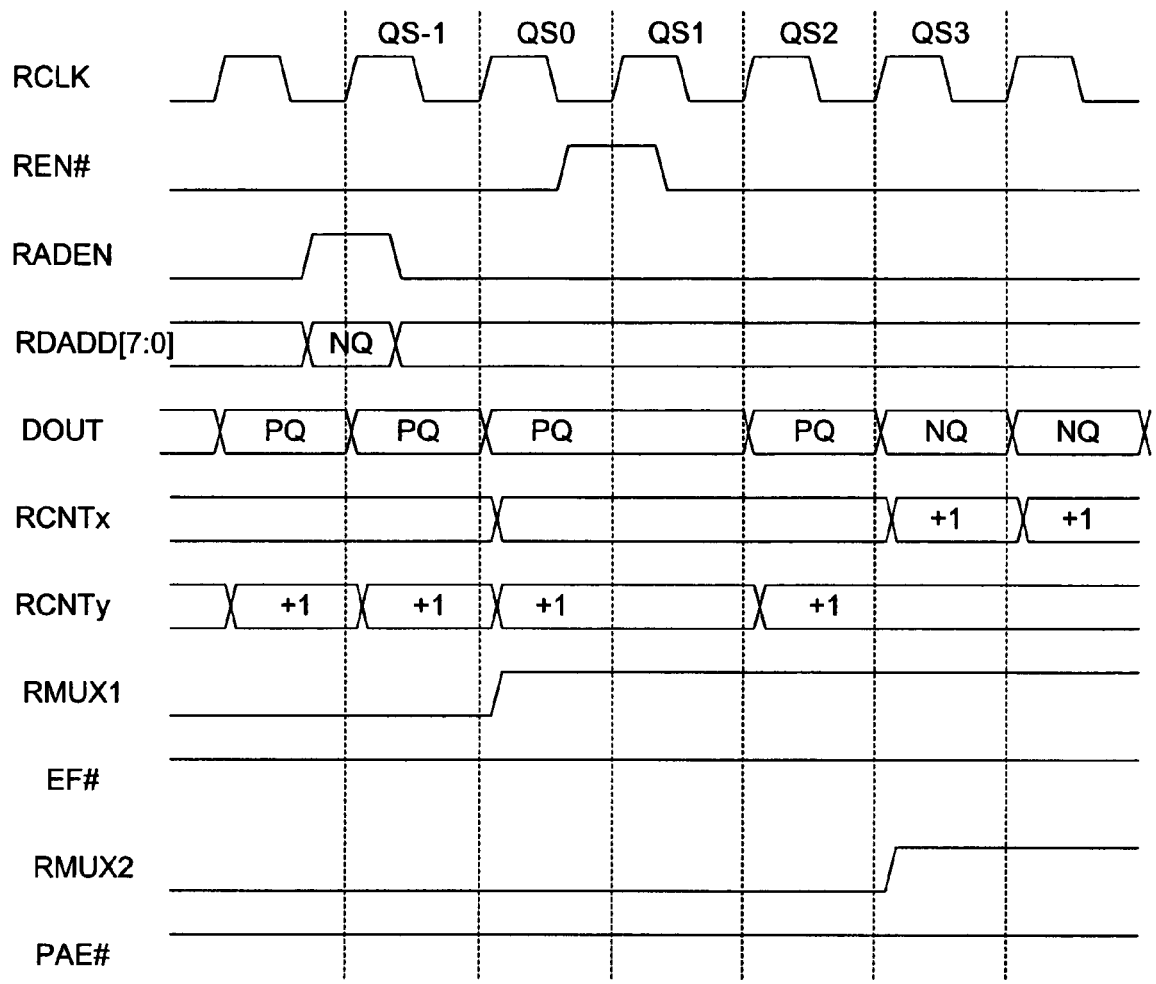

FIG. 7 is a waveform diagram illustrating the operation of read FCR system 200 in accordance with another embodiment of the present invention. The embodiment of FIG. 7 is similar to the embodiment of FIG. 4, with differences noted below. In the embodiment of FIG. 7, the read enable signal REN# is de-activated high prior to the rising edge of read cycle QS1. The logic high read enable signal REN# prevents a new data value from being read from the present queue during read cycle QS1, and prevents the read count value RCNTy from being incremented during read cycle QS1.

In the foregoing manner, a read queue switch can be implemented in a seamless and flexible manner, without requiring forced data fall through or pipelining the output data.

FIG. 8 is a block diagram of a write flag counter register (FCR) system 300, which is located in write control logic block 111 and active queue flag circuit 114, in accordance with one embodiment of the present invention. Write FCR system 300 includes write FCR file 301, register 302, multiplexers 311–314, adder circuits 320–321, write counters 350–351, and write flag logic 360. Write FCR system 300 is configured in the same manner as read FCR system 200 (FIG. 3).

Write FCR file 301 includes 128 entries, one for each possible queue in device 100. Each entry stores a write count pointer for a corresponding queue. Each entry of write FCR file 301 is coupled to register 302 via a selection circuit (not shown). As described in more detail below, register 302 latches a new write count pointer retrieved from write FCR file 301 at the start of a queue switch (during cycle QS-1). The write count pointer stored in register 302 is applied to the "1" input terminal of multiplexer 311 and the "0" input terminal of multiplexer 312.

The output terminals of multiplexers 311 and 312 are coupled to the "0" input terminals of multiplexers 313 and 314, respectively, and to adders 320 and 321, respectively. Adders 320 and 321 each add one to the write count values provided by multiplexers 311 and 312, respectively. Adders 320 and 321 apply the incremented write count values to write counters 350 and 351, respectively. Write counters 350 and 351 latch the incremented write count values on rising edges of the WCLKy and WCLKx write clock signals, respectively. Write counters 350 and 351 apply output write count values WCNTy and WCNTx, respectively, to the "0" and "1" input terminals of multiplexers 311 and 312, respectively. In the described embodiment, multiplexers 311 and 312 are controlled by the same control signal WMUX0, although this is not necessary. Multiplexers 313 and 314 are controlled by WMUX1 and WMUX2 signals, respectively. Multiplexer 313 provides an output signal WCNT1, and multiplexer 314 provides an output signal WCNT2, which are used to derive the full flag FF# and the programmable almost full flag PAF#, respectively. The WCNT2 signal is also routed back to write FCR file 301 as a write count signal, such that the write FCR file 301 is updated to store changes in the WCNT2 signal during each write cycle.

Figure 9:
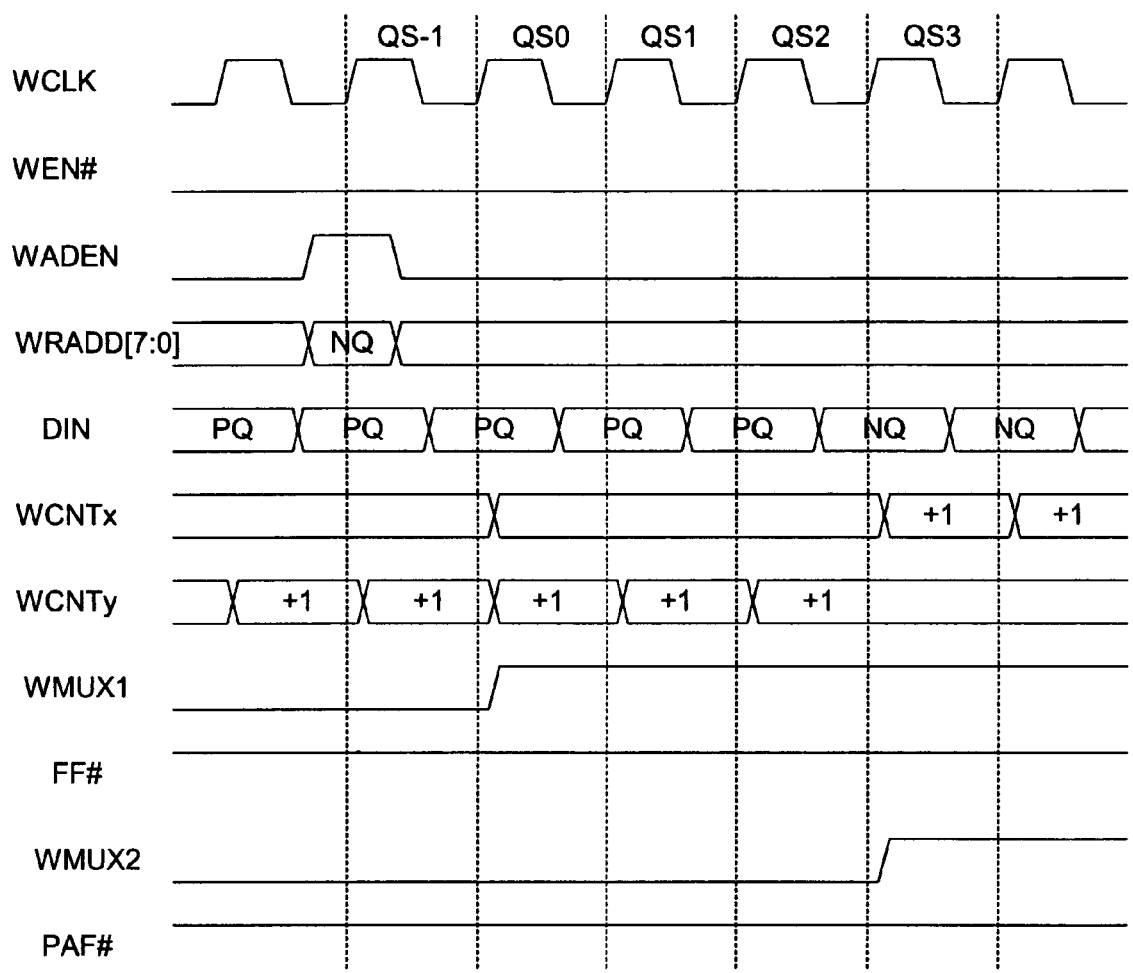
FIGS. 9, 10, 11, 12 are waveform diagrams illustrating the operation of the write FCR file of FIG. 8 in accordance with various embodiments of the present invention.

FIG. 9 is a waveform diagram illustrating the operation of write FCR system 300 in accordance with one embodiment of the present invention.

The write clock signal WCLK, write enable signal WEN#, write address enable signal WADEN and write address signal WRADD[7:0] are applied to write control logic 111 (FIG. 2). Relevant cycles of the WCLK signal are labeled QS-1, QS0, QS1, QS2 and QS3. Prior to write cycle QS-1, data is being written to a first queue in dual-port memory 101, which is hereinafter referred to as the present queue (PQ). At this time, write FCR system 300 is configured as follows. The write clock signal WCLK is routed as the write clock signal WCLKy to write counter 350. Write counter 350 maintains a write count value (WCNTy) associated with the present queue PQ. The WMUX0 signal has a logic "0" state, such that multiplexer 311 routes the WCNTy value provided by write counter 350 to multiplexers 313 and 314. The WMUX1 and WMUX2 signals both have a logic "0" value, thereby routing the WCNTy value as the WCNT1 and WCNT2 signals. Write flag logic 360 generates the full flag FF# and programmable almost full flag PAF# in response to the write count value WCNTy associated with the present queue PQ.

Each time that a write operation is performed to the present queue PQ, the write clock signal WCLKy is asserted, thereby causing write counter 350 to latch the incremented write count value (i.e., WCNTy plus 1) provided by adder circuit 320. The incremented WCNTy signal is then used to generate the FF# and PAF# flags associated with the present queue PQ. In the present example, the FF# and PAF# flags associated with the present queue PQ remain de-activated high, thereby indicating that the present queue is neither full nor almost full.

Prior to the start of write cycle QS-1, the write address enable signal WADEN transitions to a logic "1" state, thereby indicating that a queue switch (QS) will be performed. That is, the write operations to the present queue PQ will be stopped, and write operations will be performed to a new queue (NQ) in dual port memory 101. The address of the new queue NQ is identified by the write address signal WRADD[7:0]. The WADEN and WRADD[7:0] signals are detected at the beginning of write cycle QS-1 (at the rising edge of the WCLK signal).

In response to the detected WADEN signal, write FCR file 301 retrieves the write count value from the register corresponding to the queue identified by the WRADD[7:0] signal. For example, if the write address signal WRADD[7:0] identifies queue 127, then write FCR file 301 provides the write count value of queue 127. The read FCR system 200 (FIG. 3) also retrieves the read count pointer associated with the addressed queue (e.g., queue 127) on port "a" at this time. Data is written to the present queue and the write count value WCNTy is incremented during write cycle QS-1.

By the start of the next write cycle QS0, the write count pointer retrieved from write FCR file 301 has been loaded into register 302. In response to the logic "0" WMUX0 signal, multiplexer 312 routes the write count pointer stored in register 302 to the logic "1" input terminals of multiplexers 313 and 314, and to the input terminal of adder circuit 321. Also at the start of the next write cycle QS0, the WMUX1 signal transitions to a logic "1" value, thereby routing the newly retrieved write count pointer (WCNTx) associated with the new queue NQ as the WCNT1 signal. Also, at the start of read cycle QS0, the read FCR system 200 provides the newly retrieved read point counter associated with the new queue NQ as the RCNT_FF signal. In response, write flag logic 360 starts to generate a new full flag FF# in response to the retrieved read and write count pointers associated with the new queue NQ. Data (DIN) is written to the present queue (and the write count value WCNTy is incremented) during the QS0 write cycle. Note that the WCNTy value associated with the present queue PQ signal (and provided as the WCNT2 signal) and a write count pointer associated with the present queue (RCNT_PAF) are still used to generate the programmable almost full PAF# flag during the read cycle QS0.

During cycles QS1 and QS2, the write enable signal WEN# remains activated low, thereby enabling data values to be written to the present queue PQ during cycles QS1 and QS2, and enabling write clock counter 350 to increment the WCNTy value at the rising edges of write cycles QS1 and QS2. As described in more detail below, the write enable signal WEN# can be de-activated high prior to the beginning of a write cycle, thereby preventing data values from being written to the queue during the write cycle. In this case, the high WEN# signal prevents the write clock signal WCLKy from clocking write counter 350, such that the write count value WCNTy is not incremented during the write cycle.

The last data value to be written to the present queue PQ is written during write cycle QS2. The write count value WCNTy is routed through multiplexers 311 and 314 as the write count value WCNT2 to write FCR file 301. During write cycle QS2, the write count value WCNTy is stored as the write count pointer associated with the present queue PQ in write FCR file 301.

At the end of write cycle QS2, the write count value WCNTy provided by write counter 350 is representative of the exact number of write operations that have been performed to the present queue PQ, without any prediction or pipelining. Consequently, the next time the present queue is written, the write count pointer retrieved from write FCR file 301 accurately represents the last write address for this queue.

At the start of write cycle QS2, write flag logic 360 provides a full flag FF# representative of the status of the new queue NQ. As described above, this full flag FF# is provided in response to the write count pointer previously stored in register 302 during read cycle QS0 and provided as the WCNT1 signal.

Note that during cycle QS1, write flag logic 360 decodes the address of the new queue NQ, and retrieves a previously stored programmable almost full flag PAF#, which identifies the almost full status of the new queue NQ. During cycle QS2, write flag logic 360 provides the PAF# flag associated with the new queue as the active PAF# flag. The active PAF# flag associated with the new queue is then updated during cycle QS3 (and during subsequent cycles). This process provides an accurate result, because the earliest that a write operation can be performed to the new queue is during cycle QS3. The logic used to generate the programmable almost full flag is described in more detail in U.S. patent application Ser. No. 11/040,804, "Synchronization of Active Flag and Status Bus Flags in a Multi-Queue First-In First-Out Memory System", by Mario Au, Jason Z. Mo and Cheng-Han Wu, which is hereby incorporated by reference.

Also during write cycle QS2, a read count pointer associated with the new queue is retrieved on port "c" of the read FCR system 200.

During write cycle QS3, data is written to the new queue NQ. More specifically, data is written to the address of the new queue NQ identified by the write count pointer stored in register 302. At the start of write cycle QS3, the write clock signal WCLK is routed to write counter 351 as the write clock signal WCLKx. At the rising edge of write cycle QS3, write counter 351 latches an incremented write count value (WCNTx plus 1) provided by adder circuit 321. During write cycle QS3, the WMUX0 signal is controlled to have a logic "1" value, thereby causing multiplexer 312 to route the incremented write count value WCNTx from write counter 351 to multiplexers 313 and 314. The multiplexer control signal WMUX2 is controlled to have a logic "1" value, thereby routing the incremented write count value WCNTx to write flag logic 360. The read count pointer associated with the new queue is retrieved on port "c" of the read FCR system 200 and provided to write flag logic 360 as the read count pointer RCNT_PAF during cycle QS3. Write flag logic 360 then begins to generate the programmable almost full flag PAF# in response to the new write count pointer RCNT2 and the new read count pointer RCNT_PAF.

Figure 10:
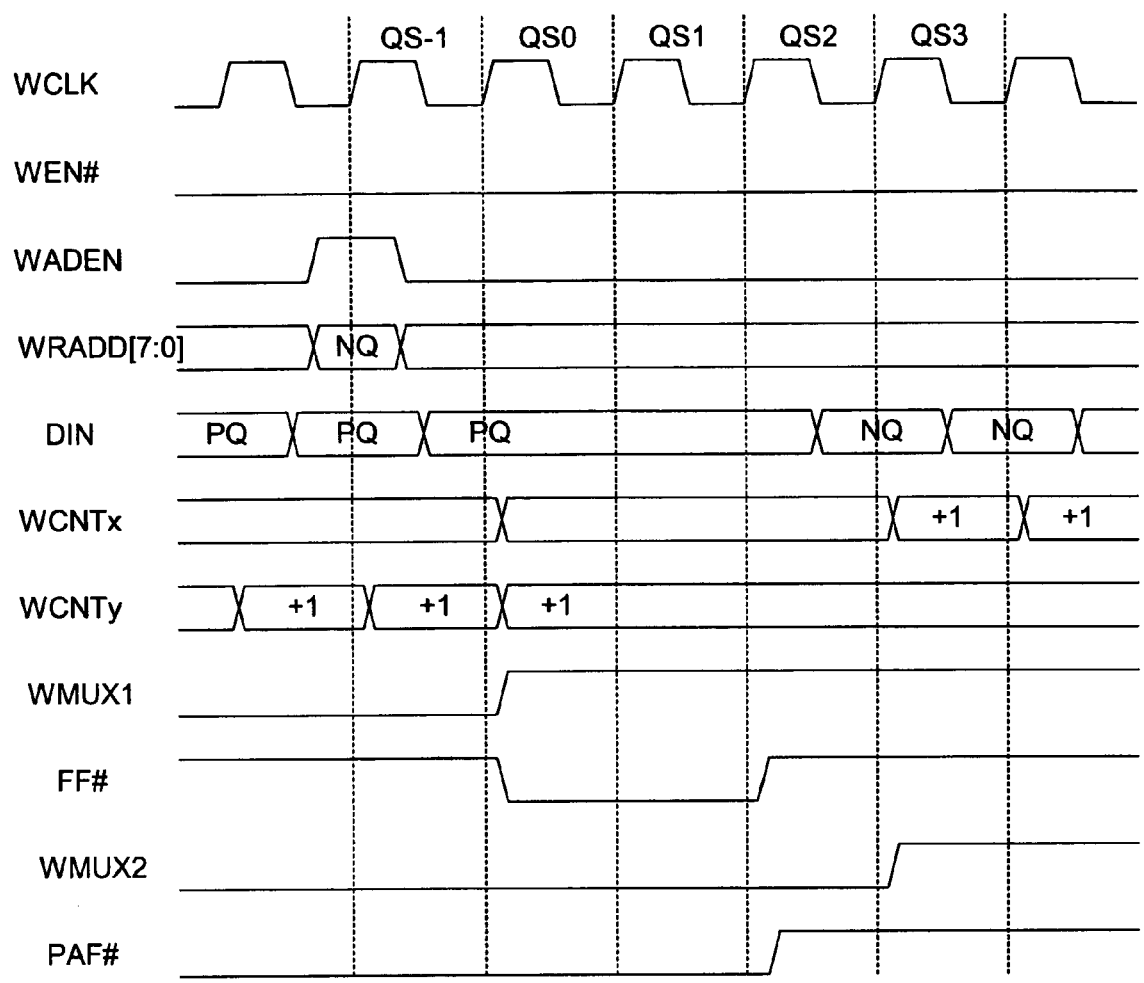

FIG. 10 is a waveform diagram illustrating the operation of write FCR system 300 in accordance with another embodiment of the present invention. The embodiment of FIG. 10 is similar to the embodiment of FIG. 9, with differences noted below. In the embodiment of FIG. 10, the last data value written to the present queue PQ is written during write cycle QS0. Because the present queue is full during write cycle QS0, the full flag FF# is activated low during this write cycle. Note that the programmable almost full flag PAF# was activated low in previous write cycles. The logic low full flag FF# prevents additional data values from being written to the present queue, and prevents the write count value WCNTy from being incremented. This is accomplished by basic FIFO read logic, which feeds back the status of the full flag FF# to prevent write operations from occurring (i.e., an internal write is only activated if the full flag FF# is high and the write enable signal WEN# is low).

The new queue NQ is neither full nor almost full in the example of FIG. 10. Consequently, the full flag FF# and programmable almost full flag PAF# are de-activated high during write cycle QS2, thereby indicating the non-full status of the new queue NQ. A data value is written to the new queue NQ during write cycle QS3 in the manner described above in connection with FIG. 9.

Figure 11:
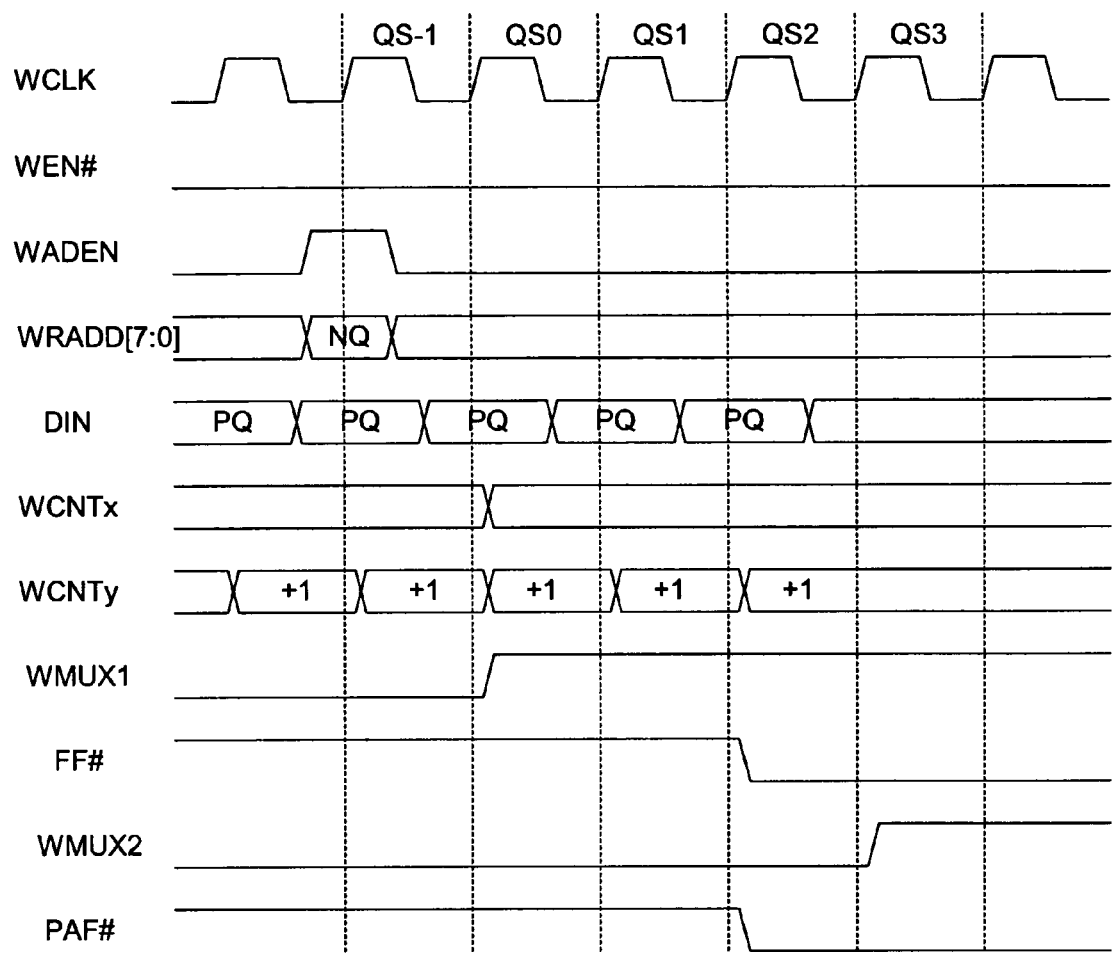

FIG. 11 is a waveform diagram illustrating the operation of write FCR system 300 in accordance with another embodiment of the present invention. The embodiment of FIG. 11 is similar to the embodiment of FIG. 9, with differences noted below. In the embodiment of FIG. 11, data values are written to the present queue PQ through write cycle QS2 in the manner described above in connection with FIG. 9. However, in the example of FIG. 11, the new queue is full during cycle QS3. Because the new queue is full, the full flag FF# and the programmable almost full flag PAF# are activated low during write cycle QS2. The logic low full flag FF# prevents data values from being written to the new queue, and prevents the write count value WCNTx from being incremented.

Figure 12:
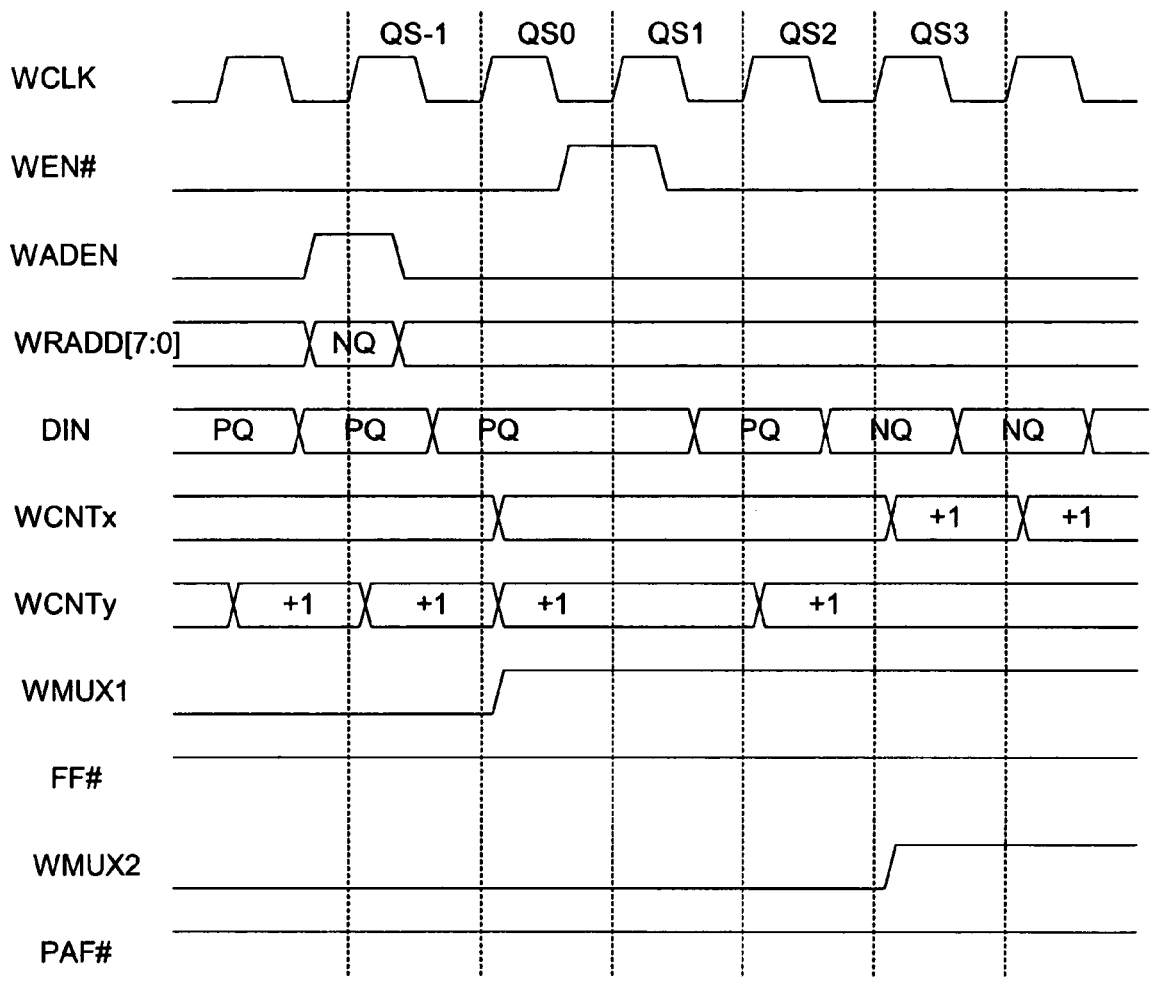

FIG. 12 is a waveform diagram illustrating the operation of write FCR system 300 in accordance with another embodiment of the present invention. The embodiment of FIG. 12 is similar to the embodiment of FIG. 9, with differences noted below. In the embodiment of FIG. 12, the write enable signal WEN# is de-activated high prior to the rising edge of write cycle QS1. The logic low write enable signal WEN# prevents a new data value from being written to the present queue during write cycle QS1, and prevents the write count value WCNTy from being incremented during write cycle QS1.

In the foregoing manner, a write queue switch can be implemented in a seamless and flexible manner, without requiring forced data fall through or pipelining the output data.

In accordance with another embodiment of the present invention, the multi-queue FIFO memory system 100 is provided with a two cycle pre-fetch scheme. That is, a read data value is provided two cycles after a corresponding word line is activated. In this embodiment, the FIFO memory array 101 is logically divided into interleaving, equal sized memory blocks. In one embodiment, each of the memory blocks has a corresponding output data bus.

Figure 13:
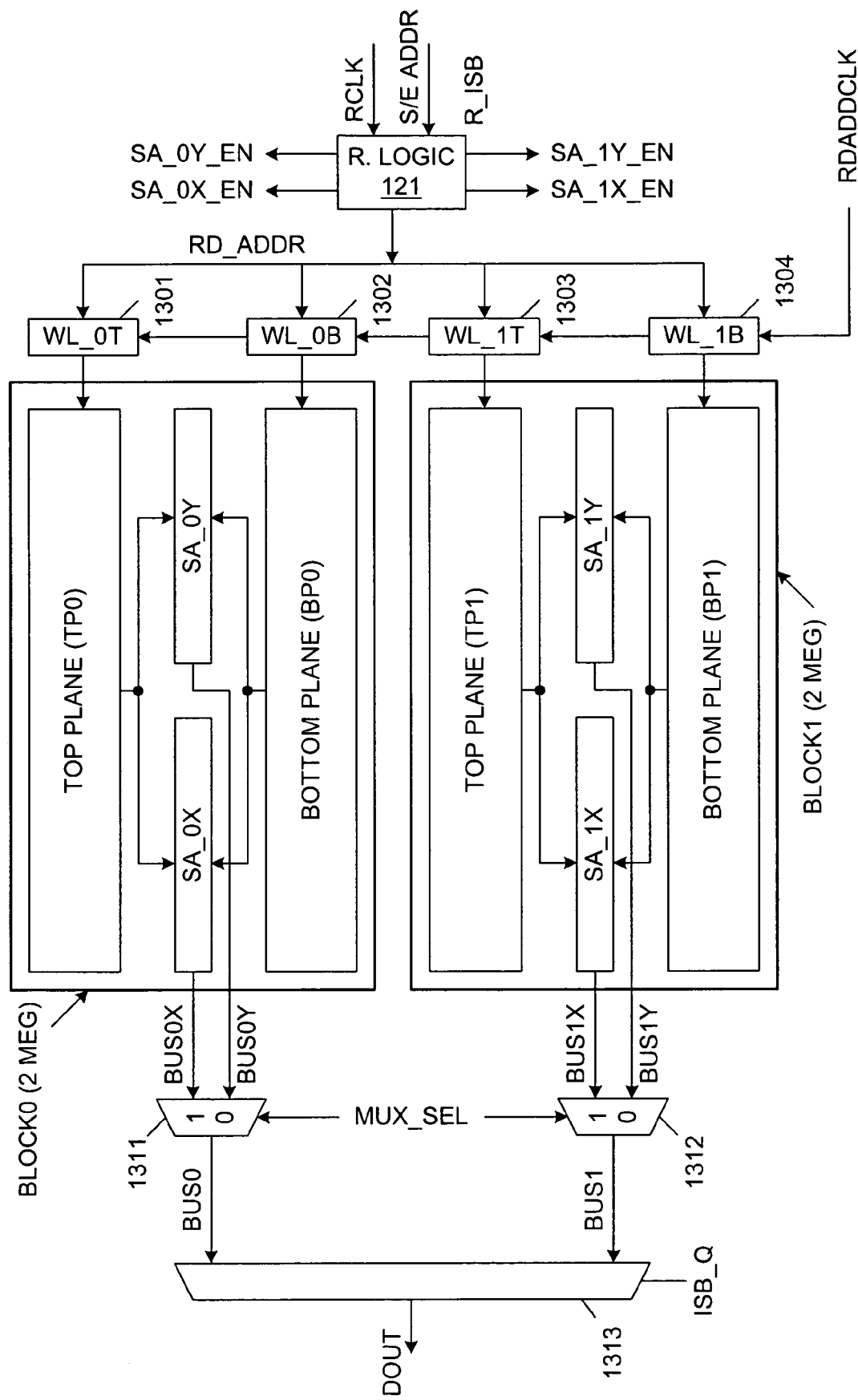
FIG. 13 is a block diagram illustrating a memory array and read control logic in accordance with one embodiment of the present invention.

FIG. 13 is a block diagram illustrating the memory array 101 and read control logic 121 in accordance with one embodiment of the present invention. In this embodiment, memory array 101 includes equal sized memory blocks BLOCK0 and BLOCK1, word line decoders 1301–1304 and multiplexers 1311–1313. Memory block BLOCK0 includes a top plane TP0, which is accessed by word line decoder 1301, a bottom plane BP0, which is accessed by word line decoder 1302, and sense amplifier circuits SA_0X and SA_0Y. Similarly, memory block BLOCK1 includes a top plane TP1, which is accessed by word line decoder 1303, a bottom plane BP1, which is accessed by word line decoder 1304, and sense amplifier circuits SA_1X and SA_1Y. In the described embodiment, top planes TP0 and TP1 and bottom planes BP0 and BP1 are each memory sub-blocks having a capacity of 1 Mb. In an alternate embodiment, memory blocks BLOCK0 and BLOCK1 are not logically divided into top and bottom planes; however, each of the memory blocks maintains two sense amplifier circuits.

In general, memory array 101 operates as follows during a read access. A queue start address, a queue end address and a read clock signal are provided to read control logic 121. In response, read control logic 121 provides a read address RD_ADDR, which is latched into word line decoders 1301–1304 in response to a read address clock signal, RDADDCLK. The read address RD_ADDR activates one of the four word line decoders 1301–1304. The activated word line decoder activates a word line and column select circuits associated with the read address RD_ADDR in the corresponding memory plane. As a result, the selected memory plane provides a read data word to the sense amplifier circuits in the memory block. For example, word line decoder 1301 may activate a word line and enable column select circuits in top plane TP0 in response to the read address RD_ADDR, thereby providing a read data word to sense amplifier circuits SA_0X and SA_0Y.

Read control logic 121 also provides sense amplifier enable signals SA_0X_EN, SA_0Y_EN, SA_1X_EN and SA_1Y_EN to sense amplifier circuits SA_0X, SA_0Y, SA_1X and SA_1Y, respectively. Read control logic 121 activates one of the sense amplifier enable signals SA_0X_EN, SA_0Y_EN, SA_1X_EN or SA_1Y_EN in response to the read address signal RD_ADDR. For example, read logic may activate sense amplifier enable signal SA_0X_EN, thereby enabling the read data word retrieved from the top plane TP0 to be latched into sense amplifier circuit SA_0X. In the described example, each of the sense amplifier circuits has a width of 36-bits.

Sense amplifier circuits SA_0X, SA_0Y, SA_1X and SA_1Y provide read data words on read data buses BUS0X, BUS0Y, BUS1X and BUS1Y, respectively. As described in more detail below, when one of the sense amplifier circuits provides a read data word, this read data word remains on the corresponding read data bus for two cycles of the read clock signal RCLK. Buses BUS0X and BUS0Y are provided to input terminals of multiplexer 1311. Similarly, buses BUS1X and BUS1Y are provided to input terminals of multiplexer 1312. Multiplexers 1311 and 1312 are controlled by a multiplexer select signal, MUX_SEL. The output terminals of multiplexers 1311 and 1312 are designated as read data buses BUS0 and BUS1, respectively. In general, read data bus BUS0 is the read output bus of memory block BLOCK0, and read data bus BUS1 is the read output bus of memory block BLOCK1. Multiplexer 1313 routes the read data word from one of the read data buses BUS0 or BUS1 as the read output data word DOUT in response to the interleaving bus signal, ISB_Q.

At the beginning of a read operation, the "empty" status of the present queue is evaluated to determine whether a data word is available to be read. During a first cycle (two cycles before the first read data word is output), a first read data word is pre-fetched from one of the memory blocks, (e.g., BLOCK0). The pre-fetched read data word remains on the associated read data bus (e.g., BUS0) for the next two cycles (i.e., the second and third cycles). During the next (second) cycle, a second read data word is pre-fetched from the other one of the memory blocks (e.g., BLOCK1). The second read data word remains on the other read data bus (e.g., BUS1) for the next two cycles (i.e., the third and fourth cycles). Because the first and second read data words are pre-fetched on separate read data buses (BUS0 and BUS1), the second read data word (read from BLOCK1) does not override the first read data word (read from BLOCK0).

The first read data word (from BLOCK0) is provided as the DOUT value during the third cycle. At this time, a new pre-fetch operation may be performed to the same memory block (BLOCK0), such that a new (third) read data word is subsequently provided on the associated read data bus (BUS0). The second read data word (from BLOCK1) is provided as the DOUT value during the fourth cycle. At this time, a new pre-fetch operation may be performed to the same memory block (BLOCK1), such that a new (fourth) read data word is subsequently provided on the associated read data bus (BUS1). Pre-fetch operations are performed as long as the present queue is not empty and there is a slot available on read data bus BUS0 or read data bus BUS1. Since each of the memory blocks (BLOCK0 and BLOCK1) is accessed at most every two cycles, the memory read of each block is performed at half of the frequency as the output read data words. As a result, the read data words have more time to propagate through the data path logic.

The multi-queue FIFO memory 100 presents an additional challenge, namely, the queue switch condition. For instance, when using the interleaving memory blocks, BLOCK0 and BLOCK1 during a queue switch, the last read data word read from the present queue may be located on either BUS0 or BUS1. Similarly, the first read data word read from the new queue may be located on either BUS0 or BUS1. The worst case exists when the last data read data word read from the present queue and the first read data word read from the new queue are provided on the same read data bus (i.e., located in the same memory block). As described in more detail below, the dual output bus scheme, in which each of the read data buses BUS0 and BUS1 is coupled to a corresponding pair of sense amplifier circuits, accommodates this worst-case condition. For example, read data bus BUS0 is coupled to sense amplifier circuits SA_0X and SA_0Y and read data bus BUS1 is coupled to sense amplifier circuits SA_1X and SA_1Y. Sense amplifier circuits SA_0X and SA_1X (i.e., buses BUS0X and BUS1X) are dedicated to one queue, while sense amplifier circuits SA_0Y and SA_1Y (i.e., buses BUS0Y and BUS1Y) are dedicated to another queue. For example, if the present queue uses sense amplifier circuits SA_0X and SA_1X (read data buses BUS0X and BUS1X), the new queue will use sense amplifier circuits SA_0Y and SA_1Y (read data buses BUS0Y and BUS1Y), such that read data words read from the new queue will not override read data words read from the present queue.

The worst-case condition requires one of the memory blocks BLOCK0 or BLOCK1 to operate at the same speed as the read data output signal DOUT during two particular cycles of the queue switch. However, the data path logic can still be evaluated in two cycles.

In order to control the read data path during a queue switch, a memory address counter scheme that uses multiple counters is provided.

Figure 14:
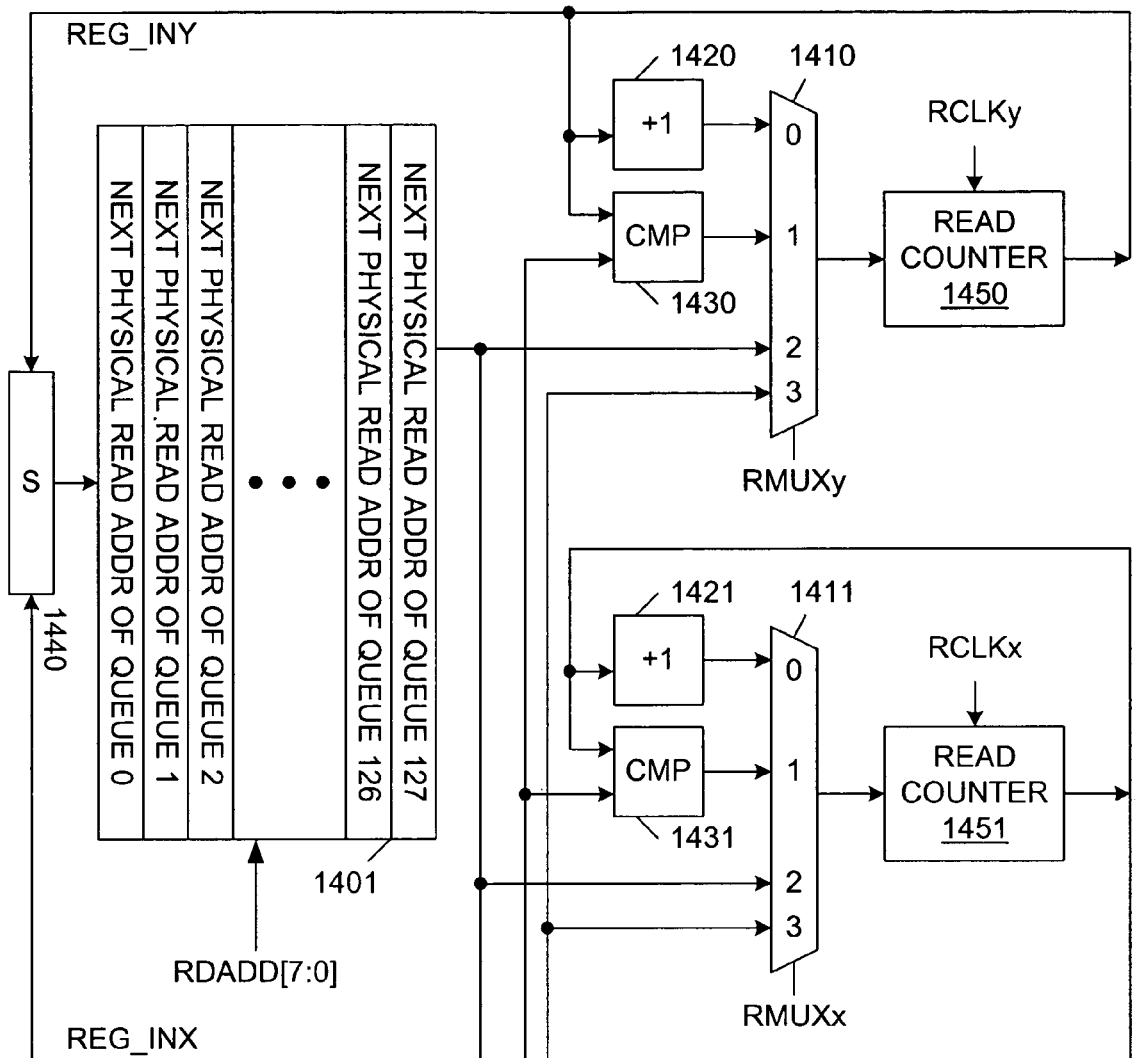
FIG. 14 is a block diagram of a read memory address register (MAR) file, which forms part of the read control logic of FIG. 13 in accordance with one embodiment of the present invention.

FIG. 14 is a block diagram of read memory address register (MAR) system 1400, which forms part of read control logic 121 in accordance with one embodiment of the present invention. Read MAR system 1400 includes read MAR file 1401, multiplexers 1410–1412, adder circuits 1420–1422, comparators 1430–1432, read-back selector 1440 and read address counters 1450–1452.

Read MAR file 1401 includes 128 entries, one for each possible queue in multi-queue device 100. Each entry stores a value equal the next physical read address of a corresponding queue, wherein the next physical read address is equal to the last physical read address, plus one. Each entry of read address file 1401 is coupled to the "2" input terminals of multiplexers 1410–1412 via a selection circuit (not shown). A start address of the queue being accessed by the read operation is applied to the "3" input terminal of multiplexers 1410–1412. The end address of the queue being accessed by the read operation is applied to comparators 1430–1432. The output terminals of comparators 1430–1432 are coupled to the "1" input terminals of multiplexers 1410–1412, respectively. The output terminals of adder circuits 1420–1422 are coupled to the "0" input terminals of multiplexers 1410–1412, respectively. Multiplexers 1410, 1411 and 1412 are controlled by multiplexer control signals RMUXy, RMUXx and RMUXz, respectively. The output terminals of multiplexers 1410–1412 are provided to input terminals of read address counters 1450–1452, respectively. Read address counters 1450, 1451 and 1452 are clocked by the RCLKy, RCLKx and RDADDCLK signals, respectively. The output terminals of read address counters 1450–1452 are coupled to input terminals of adder circuits 1420–1422, respectively, and to input terminals of comparators 1430–1432, respectively. The output signals provided by read address counters 1450 and 1451 are labeled REG_INY and REG_INX, respectively. The REG_INY and REG_INX signals are both provided to selector circuit 1440, which routes one of these signals back to read MAR file 1401.

Note that read MAR system 1400 uses three read address counters 1450, 1451 and 1452. The read address counters 1450 and 1451 are alternately used during a queue switch. That is, one of read address counters 1450–1451 keeps track of the "real" read operations from the present queue, while the other one of read counters 1450–1451 keeps track of the "real" read operations from the new queue. A "real" read operation is defined as a read operation that results in the read data word being provided as an output data value, DOUT. During a queue switch, selector circuit 1440 routes the read address value (plus one) from the read address counter used by the present queue to read MAR file 1401, such that this read address value can be written back to the read MAR file 1401.

The third read address counter 1452 is a memory address counter that is used to generate the read address signal RD_ADD (FIGS. 13–14). In general, the read address signal RD_ADD is used to pre-fetch read data words from the memory array 101 two cycles before the associated "real" read operation is performed, such that the read data words can be ready at the appropriate time. The third read address counter 1452 may advance even though no "real" read operation is performed, to prepare read data words from memory array 101 two cycles before being output. The read address value stored by the third read address counter 1452 is not written back to the read MAR file 1401.

The read address counters 1450–1452 keep track of the conditions during a queue switch, so that when processing returns to a queue during a subsequent queue switch, these conditions can be used to process data seamlessly. The current conditions that must be stored include, the last memory block accessed in the queue (which is very important for the two-block scheme to work), and in a bus matching situation, the bytes of data that have been processed. In one embodiment, three bits in each of the read address counters include: an interleaving bit (R_ISB) and bus matching bits (BMB[1:0]). The interleaving bit R_ISB identifies the next block to be accessed, and the bus matching bits BMB[1:0] identify the next byte to be accessed. For example, during a queue switch in a 36-to-9 bus matching situation, an interleaving bit R_ISB having a value of "1" and bus matching bits having a value of "10" may indicate that the new queue should be accessed starting in memory block BLOCK1, starting at the third byte.

Figure 15:
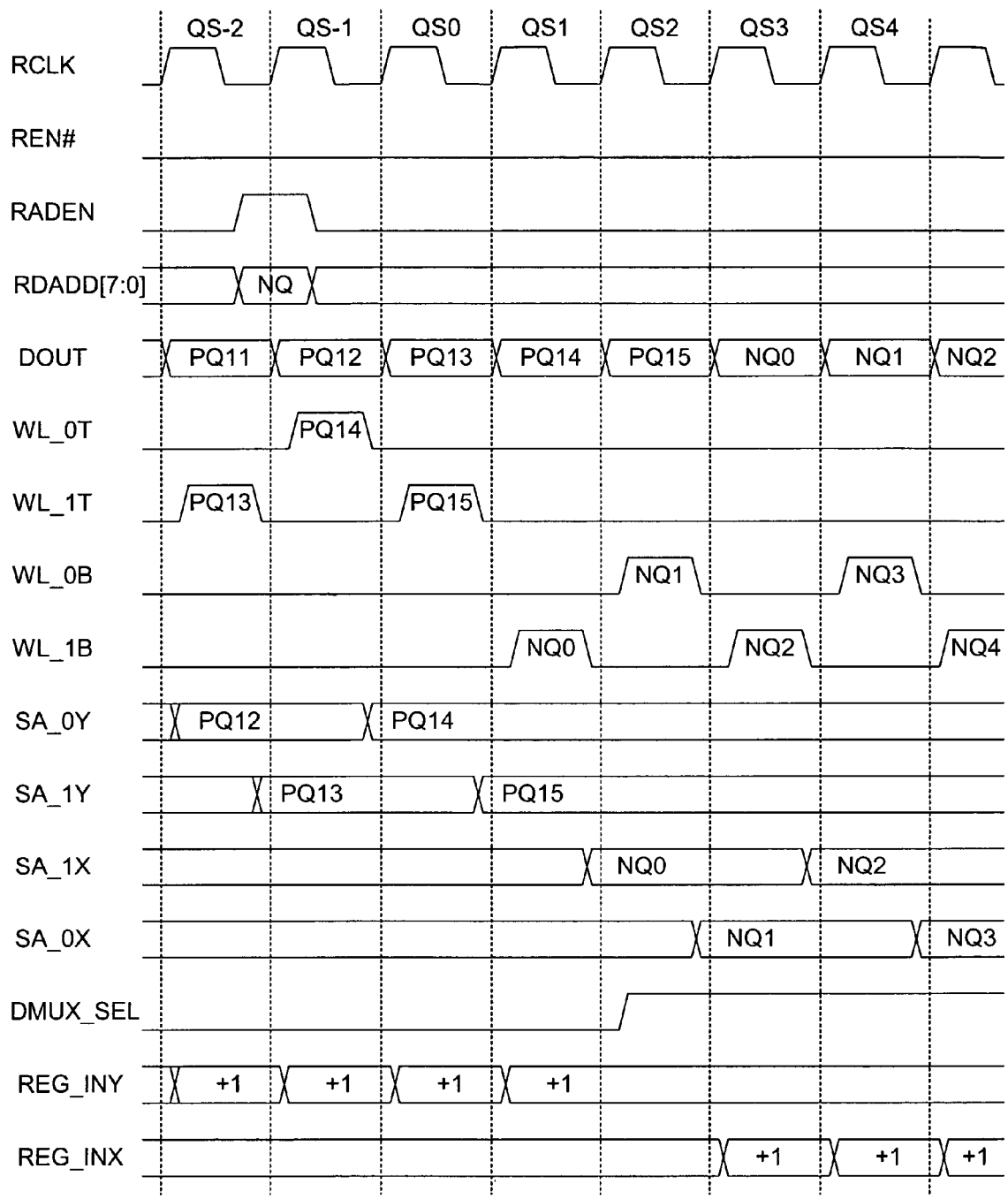
FIG. 15 is a waveform diagram illustrating a read operation to memory array in accordance with one embodiment of the present invention.

FIG. 15 is a waveform diagram illustrating a read operation to memory array 101 in accordance with one embodiment of the present invention. The illustrated read operation includes a queue switch.

The read clock signal RCLK, read enable signal REN#, read address enable signal RADEN and read address signal RDADD[7:0] are applied to read control logic 121 (FIG. 13). The read address signal identifies the queue to be read. In response to the read address signal, a queue start address and a queue end address associated with the queue to be read are retrieved from a queue address memory (not shown). The queue address memory is described in more detail in U.S. patent application Ser. No. 11/040,926 "Multi-Queue Address Generator for Start and End Addresses in a Multi-Queue First-In First-Out Memory System" by Mario Au, Jason Z. Mo and Xiaoping Fang. The queue start and end addresses enable address "wrap-around" during successive read operations from the active queue. In general, read operations are performed until the read address provided by a read address counter (e.g., the REG_INY signal provided by read counter 1450) matches the queue end address. At this time, the associated comparator (e.g., comparator 1430) indicates a match condition. In response, the associated multiplexer (e.g., multiplexer 1410) is controlled to route the queue start address to the read address counter, such that the queue start address is loaded into the read address counter. In this manner, the read address wraps around from the queue end address to the queue start address.

In FIG. 14, relevant cycles of the RCLK signal are labeled QS-2, QS-1, QS0, QS1, QS2, QS3 and QS4. Prior to read cycle QS-1, data is being read from a first queue, which is hereinafter referred to as the present queue (PQ). At this time, read MAR system 1400 is configured as follows. The read clock signal RCLK is routed as the read clock signal RCLKy to read address counter 1450. Read address counter 1450 maintains a read address value (REG_INY) associated with the present queue PQ. The RMUXy signal has a logic "0" value, such that the incremented read address value provided by adder circuit 1420 is routed to read address counter 1450. Thus, each time that a read data word from the present queue is provided as a read data value DOUT, the read address value REG_INY is incremented.

Read address counter 1452 provides the read address RD_ADDR in the manner described above. That is, read address counter 1452 helps to generate a read address RD_ADDR which is one address location ahead of the read address value REG_INY, thereby allowing the read data words to be pre-fetched from memory array 101. The RMUXz signal has a logic "0" value, such that the incremented read address value provided by adder circuit 1422 is routed to read address counter 1452. Thus, each time that a read operation is performed to memory array 101, the read address RD_ADD is incremented.

For example, during read cycle QS-2, a read data value PQ11 previously read from BLOCK1 (and stored in sense amplifier circuit SA_1Y) is provided as the read data word DOUT. Also during read cycle QS-2, sense amplifier circuit SA_0Y provides another read data word PQ12 from memory block BLOCK0 on BUS0, and the REG_INY value is incremented. In addition, word line select circuit 1303 (WL_1T) activates a word line (and column switches) to access another read data word PQ13 from memory block BLOCK1. Read address counter 1452 is also incremented by the read address clock RDADDCLK (not shown).

Prior to the start of read cycle QS-1, the read address enable signal RADEN transitions to a logic "1" state, thereby indicating that a queue switch (QS) will be performed. That is, the read operations from the present queue PQ will subsequently be stopped, and read operations will be performed from a new queue (NQ) in dual port memory 101. The address of the new queue NQ is identified by the read address signal RDADD[7:0]. The RADEN and RDADD[7:0] signals are detected at the beginning of read cycle QS-1 (at the rising edge of the RCLK signal).

In response to the detected RADEN signal, read MAR file 1401 retrieves the read address value from the register corresponding to the queue identified by the RDADD[7:0] signal. For example, if the read address signal RDADD[7:0] identifies queue 2, then read MAR file 1401 provides the read address value of queue 2 to the "2" input terminal of multiplexer 1412. However, the RMUXz signal is controlled to have a logic "0" value, such that the read address counter 1452 continues to provide a read address RD_ADD associated with the present queue. Also during read cycle QS-1, the read data value PQ12 (previously read from BLOCK0 and stored in sense amplifier circuit SA_0Y during read cycle QS-2) is provided as the output read data word DOUT. In addition, sense amplifier circuit $SA_{13}$ 1Y provides a read data word PQ13 read from memory block BLOCK1 on BUS1, and the REG_INY value is incremented. Word line select circuit 1301 (WL_0T) also activates a word line (and column switches) to access another read data word PQ14 from memory block BLOCK0. Read address counter 1452 is also incremented by the read address clock RDADDCLK (not shown).

Note that, as shown in FIG. 15, the read data word PQ12 read from BLOCK0 stays on the associated bus (BUS0) for two cycles (QS-2 and QS-1). The next read data word PQ13 is read out from BLOCK1 during the next cycle (QS-1) and stays on the associated bus (BUS1) for the next two cycles (QS-1 and QS0), such that the data word PQ13 read from BLOCK1 does not override the data word PQ12 read from BLOCK0.

During cycle QS0, a read data value PQ13 (previously read from BLOCK1 and stored in sense amplifier circuit SA_1Y during read cycle QS-1) is provided as the output read data word DOUT. In addition, sense amplifier circuit SA_0Y provides a read data word PQ14 read from memory block BLOCK0 on BUS0, and the REG_INY value is incremented. Word select circuit 1303 (WL_1T) also activates a word line (and column switches) to access another read data word PQ15 from memory block BLOCK1. Read address counter 1452 is also incremented by the read address clock RDADDCLK (not shown).

During cycle QS1, a read data value PQ14 (previously read from BLOCK0 and stored in sense amplifier circuit SA_0Y during read cycle QS0) is provided as the output read data word DOUT. In addition, sense amplifier circuit SA_1Y provides a read data word PQ15 read from memory block BLOCK1 on BUS1, and the REG_INY value is incremented. At the start of cycle QS1, the RMUXz signal transitions to a logic "2" value, such that the read pointer value retrieved from read MAR file 1401 is provided as the read address signal RD_ADD. In response, word line select circuit 1304 (WL_1B) activates a word line to access the first read data word NQ0 associated with the new queue from memory block BLOCK1. Note that during cycle QS1, the queue start and end addresses associated with the new queue are provided to multiplexer 1412 (FIG. 14). Although the last read data word PQ15 from the present queue and the first read data word NQ0 from the new queue are both read from the same memory block (BLOCK1), this is not necessary.

During cycle QS2, a read data value PQ15 (previously read from BLOCK1 and stored in sense amplifier circuit SA_1Y during read cycle QS1) is provided as the read data word DOUT. Note that the REG_INY value is incremented during cycle QS2. The REG_INY value, which accurately represents the "real" read operations performed to the present queue PQ is written back to read address memory file 1401 during cycle QS2.

Also during read cycle QS2, sense amplifier circuit SA_1X provides a read data word NQ0 read from memory block BLOCK1 on BUS1. The DMUX_SEL signal also transitions from a logic "0" value to a logic "1" value, such that the read data word NQ0 may be routed as the output read data value DOUT during the next cycle QS3. Word line select circuit 1302 (WL_0B) activates a word line (and column switches) to access the second read data word NQ1 associated with the new queue from memory block BLOCK0.

Also during read cycle QS2, the RMUXx signal transitions to a logic "2" value, such that the read address value retrieved from read MAR file 1401 is loaded into read address counter 1451 as the REG_INX value. Note that during cycle QS2, the queue start and end addresses associated with the new queue are provided to read multiplexer 1411 (FIG. 14). Read address counter 1452 is also incremented by the read address clock RDADDCLK (not shown).

During cycle QS3, a read data value NQ0 (previously read from BLOCK1 and stored in sense amplifier circuit SA1X during cycle QS2) is provided as the read data word DOUT. In addition, sense amplifier circuit SA_0X provides a read data word NQ1 read from memory block BLOCK0 on BUS0. In addition, the RMUXx signal is controlled to have a logic "0" value, such that the incremented REG_INX value provided by adder circuit 1421 is loaded into read address counter 1451.

Word select circuit 1304 (WL_1B) also activates a word line (and column switches) to access another read data word NQ2 from memory block BLOCK1. Read address counter 1452 is also incremented by the read address clock RDAD-DCLK (not shown).

During cycle QS4, a read data value NQ1 (previously read from BLOCK0 and stored in sense amplifier circuit SA_0X during cycle QS23 is provided as the read data word DOUT. In addition, sense amplifier circuit SA_1X provides a read data word NQ2 read from memory block BLOCK1 on BUS1, and the REG_INX value is incremented. Word select circuit 1302 (WL_0B) also activates a word line (and column switches) to access another read data word NQ3 from memory block BLOCK0. Read address counter 1452 is also incremented by the read address clock RDADDCLK (not shown).

Processing continues in this manner, with the queue switch having been completed in a seamless manner.

In an alternative embodiment, a single memory block having two output buses can be used. In this embodiment, data values are alternately read out to the two output buses. Each data value remains on the corresponding bus for two cycles. As a result, the data values have more time to propagate through the data path logic. However, the memory read access must be performed at the same frequency as the data output signal. Thus, while the present embodiment relieves the timing bottleneck on the data path logic, careful memory read design is still required.

Figure 16:
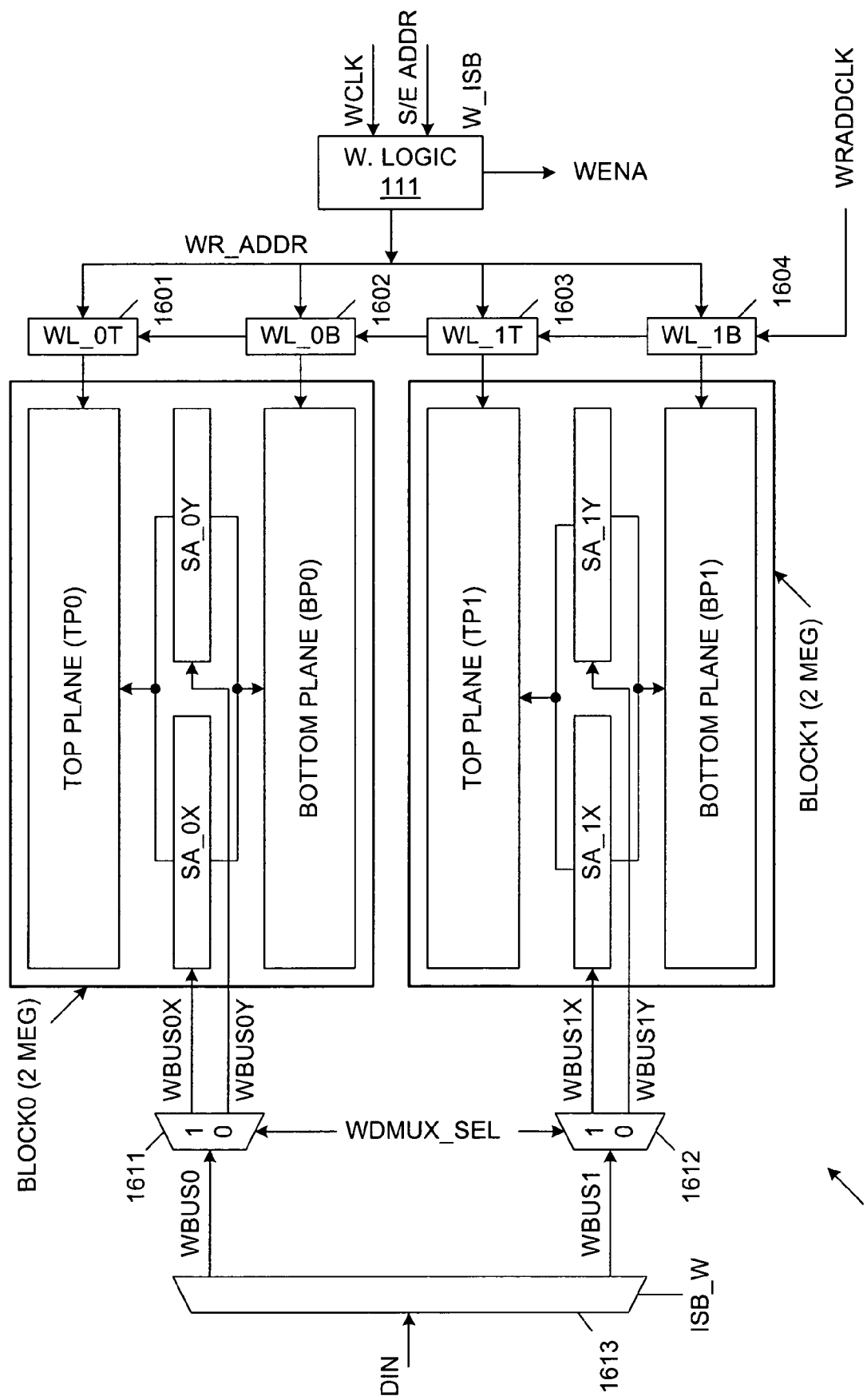
FIG. 16 is a block diagram illustrating a memory array and write control logic in accordance with one embodiment of the present invention.

FIG. 16 is a block diagram illustrating the memory array 101 and write control logic 111 in accordance with one embodiment of the present invention. In this embodiment, memory array 101 includes equal sized memory blocks BLOCK0 and BLOCK1 (which have been described above), word line decoders 1601–1604 and de-multiplexers 1611–1613. Memory planes TP0, BP0, TP1 and BP0 are accessed by word line decoders 1601, 1602, 1603 and 1604, respectively.

In general, memory array 101 operates as follows during a write access. A queue start address, a queue end address and a write clock signal are provided to write control logic 111. In response, write control logic 111 provides a write address WD_ADDR, which is latched into word line decoders 1601–1604 in response to a write address clock signal, WRADDCLK. The write address WR_ADDR activates one of the four word line decoders 1601–1604. The activated word line decoder activates a word line and column select circuits associated with the write address WR_ADDR in the corresponding memory plane.

An ISB_W bit of the write address WR_ADDR causes de-multiplexer 1613 to route a write data input word DIN on either write bus WBUS0 or write bus WBUS1. A write d-multiplexer select signal WDMUX_SEL, which is also derived from the write address WR_ADDR, controls de-multiplexers 1611–1612. If the WDMUX_SEL signal has a logic "1" state, then write buses WBUS0 and WBUS1 are coupled to sense amplifiers SA_0X and SA_1X, respectively, by write buses WBUS0X and WBUS1X, respectively. If the WDMUX_SEL signal has a logic "0" state, then write buses WBUS0 and WBUS1 are coupled to sense amplifiers SA_0Y and SA_1Y, respectively, by write buses WBUS0Y and WBUS1Y, respectively.

Write logic 111 also activates a write enable signal WENA, which is applied to all of the sense amplifier circuits SA_0X, SA_0Y, SA_1X and SA_1Y. As a result, the write data word DIN is latched into each of these sense amplifier circuits. The write data word is then written from one of the sense amplifier circuits to the addressed location in the memory blocks BLOCK0 and BLOCK1.

For example, word line decoder 1601 may activate a word line and enable column select circuits in top plane TP0 in response to the write address WR_ADDR. The ISB_W and WDMUX_SEL signals may cause the data input word DIN to be applied to sense amplifier circuits SA_0X and SA_1X, while the WENA signal causes these sense amplifier circuits to latch the data input word DIN. The input data word DIN is routed to the desired memory cells by the enabled word line and column select circuits in top plane TP0.

Figure 17:
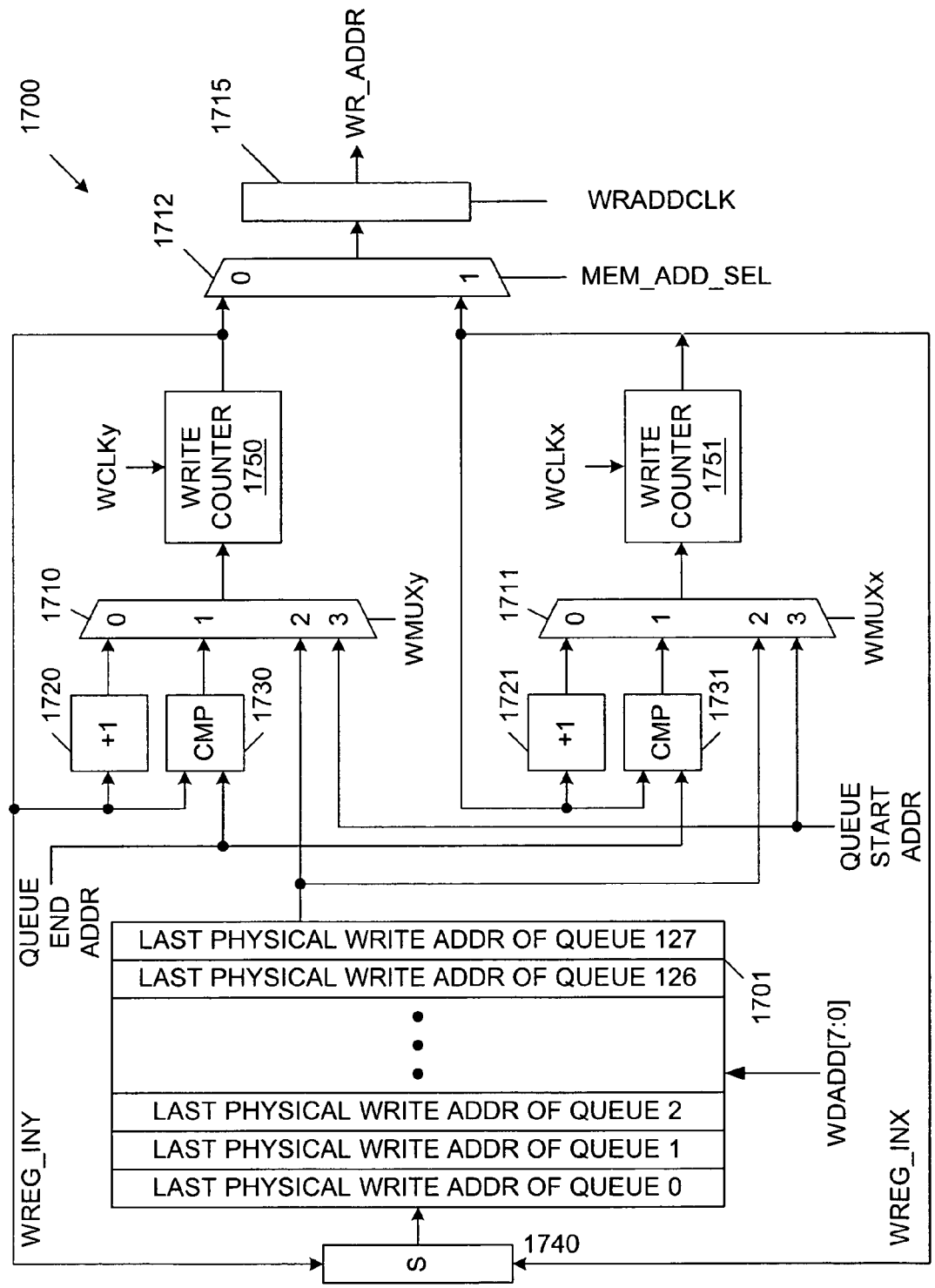
FIG. 17 is a block diagram of write read memory address register file, which forms part of the write control logic of FIG. 16 in accordance with one embodiment of the present invention.

FIG. 17 is a block diagram of write read memory address register (MAR) system 1700, which forms part of write control logic 111 in accordance with one embodiment of the present invention. Write MAR system 1700 includes write MAR file 1701, multiplexers 1710–1712, adder circuits 1720–1721, comparators 1730–1731, selector circuit 1740 and write address counters 1750–1751.

Write MAR file 1701 includes 128 entries, one for each possible queue in multi-queue device 100. Each entry stores the next write address of a corresponding queue. Each entry of write address file 1701 is coupled to the "2" input terminals of multiplexers 1710–1711 via a selection circuit (not shown). A queue start address of the queue being written is applied to the "3" input terminal of multiplexers 1710–1711. A queue end address of the queue being written is applied to comparators 1730–1731. The output terminals of comparators 1730–1731 are coupled to the "1" input terminals of multiplexers 1710–1711, respectively. The output terminals of adder circuits 1720–1721 are coupled to the "0" input terminals of multiplexers 1710–1711, respectively. Multiplexers 1710 and 1711 are controlled by multiplexer control signals WMUXy and WMUXx, respectively. The output terminals of multiplexers 1710–1711 are provided to input terminals of write address counters 1750–1751, respectively. Write address counters 1750 and 1751 are clocked by the WCLKy and WCLKx signals, respectively. The output terminals of write address counters 1750–1751 are coupled to input terminals of adder circuits 1720–1721, respectively, and to input terminals of comparators 1730–1731, respectively. The output signals provided by write address counters 1750 and 1751 are labeled WREG_INY and WREG_INX, respectively. The WREG_INY and WREG_INX signals are both provided to selector circuit 1740, which routes one of these signals back to write MAR file 1701.

Note that write MAR system 1700 uses two write address counters 1750 and 1751. The write address counters 1750 and 1751 are alternately used during a queue switch. That is, one of write address counters 1750–1751 keeps track of write operations to the present queue, while the other one of write counters 1750–1751 keeps track of write operations to the new queue. During a queue switch, selector circuit 1740 routes the write address value from the write address counter used by the present queue to write MAR file 1701, such that this write address value can be written back to the write MAR file 1701.

Initially, the present queue may use write address counter 1750, while write address counter 1751 is idle. During the queue switch, the new queue uses write address counter 1751 while the present queue continues to use write address counter 1750 until cycle QS3. During cycle QS1, the initial address value for the new queue is retrieved from the write MAR file 1701, and is clocked into write address counter 1751 during cycle QS2. As a result, data can be written into the new queue during cycle QS3. At the same time (during cycles QS1 and QS2), write address counter 1750 continues counting if there is an external write on the present queue, without affecting the preparation of new queue in write counter 1751. The queue start and end addresses associated with the new queue are provided to multiplexers 1710 and 1711 during cycle QS2. The queue start and end addresses allow the write address to wrap-around in the manner described above in connection with the read operations.

In accordance with one example, the present queue PQ uses write counter 1750, and the write clock signal WCLK is provided as the write clock signal WCLKy. The MEM_ADD_SEL signal initially has a logic "0" value, such that the WREG_INY address value provided by write address counter 1750 is routed to register 1715. When the WRADDCLK signal is incremented, the WREG_INY address value is latched into register 1715 and provided as the write address WR_ADDR. As described above, the WADEN signal is activated to initiate a queue switch. During write cycle QS-1, the new queue address is read out from write MAR file 1701. The MEM_ADD_SEL signal transitions from a logic "0" value to a logic "1" value during write cycle QS2. During write cycle QS2, the write clock signal WCLK is provided as the write clock signal WCLKx, thereby causing write address counter 1751 to store the new queue address retrieved from write MAR file 1701. During write cycle QS3, register 1715 provides the new queue address as the WR_ADDR signal after the WRADDCLK signal is activated. If the write enable signal WEN# is not active during write cycle QS3, then the write clock signal WCLKx is not activated to advance write address counter 1751, and the memory address WREG_INX stays the same. If the write enable signal WEN# is not activated until the next queue switch, then the same memory address WREG_INX is written back to the write MAR file 1701.

If the write enable signal WEN# is active during write cycle QS2, the last write data value is written to the present queue after the WRADDCLK signal clocks the present queue memory address WREG_INY into register 1715. After this occurs, the MEM_ADD_SEL signal toggles to a logic "1" state, and the write address value WREG_INY is incremented by one. The incremented write address value WREG_INY is written back to write MAR file 1701. This incremented write address value WREG_INY is used the next time a write operation is performed to the present queue.

If the write enable signal WEN# is not active during write cycle QS2, the write clock signal WCLKy does not toggle, and the (un-incremented) write address value WREG_INY is written back to write MAR file 1701. No memory write is performed, because there is no write enable pulse/word line pulse. The new queue memory address overwrites the present queue address stored in register 1715 during write cycle QS3.

Although the invention has been described in connection with several embodiments, it is understood that this invention is not limited to the embodiments disclosed, but is capable of various modifications, which would be apparent to one of ordinary skill in the art. Thus, the present invention is only intended to be limited by the following claims.

We claim:

1. A multi-queue memory system comprising:
a first memory block having a first array of memory cells, a first sense amplifier circuit coupled to the first array of memory cells and a second sense amplifier circuit coupled to the first array of memory cells, wherein the first and second sense amplifier circuits are coupled to receive first and second sense amplifier enable signals, respectively; and
a second memory block having a second array of memory cells, a third sense amplifier circuit coupled to the second array of memory cells and a fourth sense amplifier circuit coupled to the second array of memory cells, wherein the third and fourth sense amplifier circuits are coupled to receive third and fourth sense amplifier enable signals, respectively, wherein the multi-queue memory system includes a plurality of queues, each having entries in both the first and second memory blocks.

2. The multi-queue memory system of claim 1, wherein the first array of memory cells comprises a first plane of memory cells and a second plane of memory cells, and wherein the second array of memory cells comprises a third plane of memory cells and a fourth plane of memory cells.

3. The multi-queue memory system of claim 2, further comprising:
a first word line decoder coupled to the first plane of memory cells;
a second word line decoder coupled to the second plane of memory cells;
a third word line decoder coupled to the third plane of memory cells;
a fourth word line decoder coupled to the fourth plane of memory cells; and
access logic configured to provide an address signal to the first, second, third and fourth word line decoders.

4. The multi-queue memory system of claim 1, further comprising:
a first bus coupled to the first sense amplifier circuit;
a second bus coupled to the second sense amplifier circuit;
a third bus coupled to the third sense amplifier circuit; and
a fourth bus coupled to the fourth sense amplifier circuit.

5. The multi-queue memory system of claim 4, further comprising:
a first multiplexer coupled to the first bus and the second bus;
a second multiplexer coupled to the third bus and the fourth bus; and
a third multiplexer coupled to outputs of the first and second multiplexers.

6. The multi-queue memory system of claim 4, further comprising:
a first de-multiplexer coupled to the first bus and the second bus;
a second de-multiplexer coupled to the third bus and the fourth bus; and
a third de-multiplexer coupled to inputs of the first and second de-multiplexers.

7. A read memory address register system for a multi-queue memory system, comprising:
a first read counter configured to store a first read address used to pre-fetch read data from a queue of the multi-queue memory system;
a second read counter configured to store a second read address associated with a read data value read from a first queue of the multi-queue memory system; and a third read counter configured to store a third read address associated with a read data value read from a second queue of the multi-queue memory system.

8. A method of operating a multi-queue memory system comprising:
reading a first data value associated with a first queue from a first memory block during a first read cycle; then
reading a second data value associated with the first queue from a second memory block during a second read cycle; and then
reading a third data value associated with a second queue from either the first memory block or the second memory block during a third read cycle.

9. The method of claim 8, wherein the third data value is read from the second memory block during the third read cycle, the method further comprising reading a fourth data value associated with the second queue from the first memory block during a fourth read cycle.

10. A method of operating a multi-queue memory system comprising:
writing a first data value associated with a first queue to a first memory block during a first write cycle; then
writing a second data value associated with the first queue to a second memory block during a second write cycle; and then
writing a third data value associated with a second queue to either the first memory block or the second memory block during a third write cycle.

11. The method of claim 10, wherein the third data value is written to the second memory block during the third write cycle, the method further comprising writing a fourth data value associated with the second queue to the first memory block during a fourth write cycle.

* * * * *